(12) United States Patent
Date

(10) Patent No.: US 9,792,996 B1
(45) Date of Patent: Oct. 17, 2017

(54) SEMICONDUCTOR MEMORY DEVICE WHICH APPLIES MULTIPLE VOLTAGES TO THE WORD LINE

(71) Applicant: TOSHIBA MEMORY CORPORATION, Minato-ku, Tokyo (JP)

(72) Inventor: Hiroki Date, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/265,810

(22) Filed: Sep. 14, 2016

(30) Foreign Application Priority Data

May 31, 2016 (JP) .................................. 2016-108783

(51) Int. Cl.
| | | |
|---|---|---|
| G11C 16/26 | (2006.01) | |
| G11C 16/12 | (2006.01) | |
| G11C 16/16 | (2006.01) | |
| G11C 16/08 | (2006.01) | |
| G11C 16/34 | (2006.01) | |
| G11C 16/04 | (2006.01) | |

(52) U.S. Cl.
CPC .......... *G11C 16/26* (2013.01); *G11C 16/0483* (2013.01); *G11C 16/08* (2013.01); *G11C 16/12* (2013.01); *G11C 16/16* (2013.01); *G11C 16/3459* (2013.01)

(58) Field of Classification Search
CPC ......... G11C 16/08; G11C 16/12; G11C 16/16; G11C 16/26; G11C 16/0483; G11C 16/3459
USPC .......................... 365/185.23, 185.25, 185.02
See application file for complete search history.

(56) References Cited

U.S. PATENT DOCUMENTS

| | | | | |
|---|---|---|---|---|
| 5,537,358 A | * | 7/1996 | Fong ..................... | G11C 16/16 365/185.29 |
| 6,134,146 A | * | 10/2000 | Bill ....................... | G11C 16/08 365/185.23 |
| 7,649,783 B2 | * | 1/2010 | Yu ........................ | G11C 11/5642 365/185.03 |
| 8,363,507 B2 | | 1/2013 | Cho | |
| 8,773,917 B2 | * | 7/2014 | Yuh ..................... | G11C 11/5628 365/185.22 |
| 8,830,783 B2 | | 9/2014 | Idgunji et al. | |
| 9,236,128 B1 | * | 1/2016 | Louie .................. | H01L 27/1157 |
| 9,318,210 B1 | * | 4/2016 | Hart ..................... | G11C 11/5642 |
| 2007/0019467 A1 | * | 1/2007 | Toda .................... | G11C 11/5642 365/185.2 |
| 2008/0037346 A1 | | 2/2008 | Houston | |
| 2012/0314483 A1 | * | 12/2012 | Tsukada ............... | G11C 11/403 365/149 |

(Continued)

OTHER PUBLICATIONS

Taiwanese Office Action dated Jul. 11, 2017 issued in counterpart Taiwanese Application No. 105125360.

*Primary Examiner* — Vu Le
*Assistant Examiner* — Sung Cho
(74) *Attorney, Agent, or Firm* — Holtz, Holtz & Volek PC

(57) ABSTRACT

According to one embodiment, a semiconductor memory device includes a word line and a driver. The word line coupled to a memory cell. The driver is configured to apply a voltage to the word line. When a voltage applied to the word line is changed from a first voltage to a second voltage, the driver applies a third voltage according to a voltage difference between the first voltage and the second voltage to the word line.

8 Claims, 22 Drawing Sheets

(56) References Cited

U.S. PATENT DOCUMENTS

| | | | |
|---|---|---|---|
| 2014/0328122 A1 | 11/2014 | Barth | |
| 2015/0063032 A1* | 3/2015 | Shimura | G11C 16/3459 |
| | | | 365/185.17 |
| 2016/0035423 A1* | 2/2016 | Nam | G11C 16/08 |
| | | | 365/185.11 |

* cited by examiner

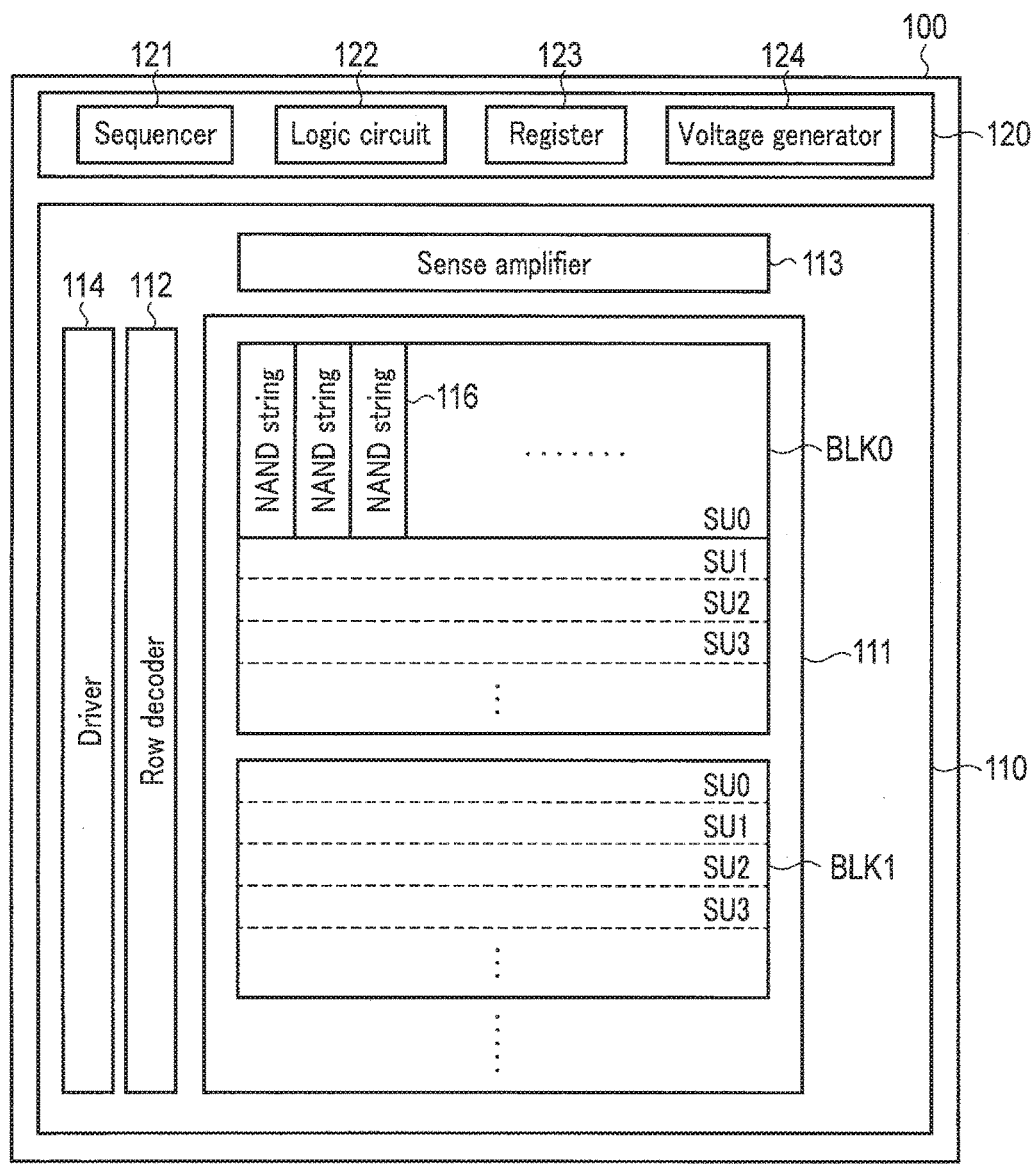
F I G. 2

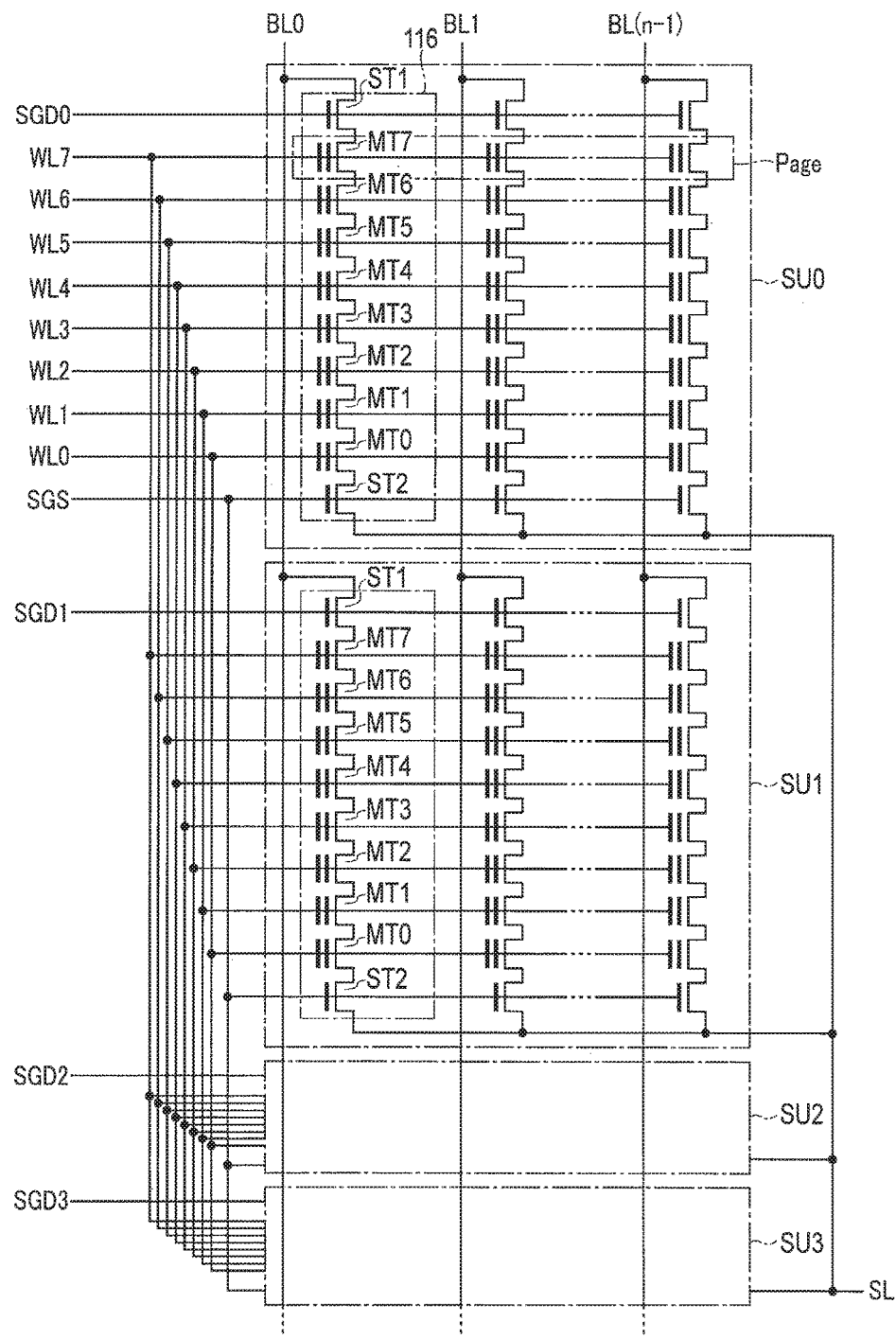
F I G. 3

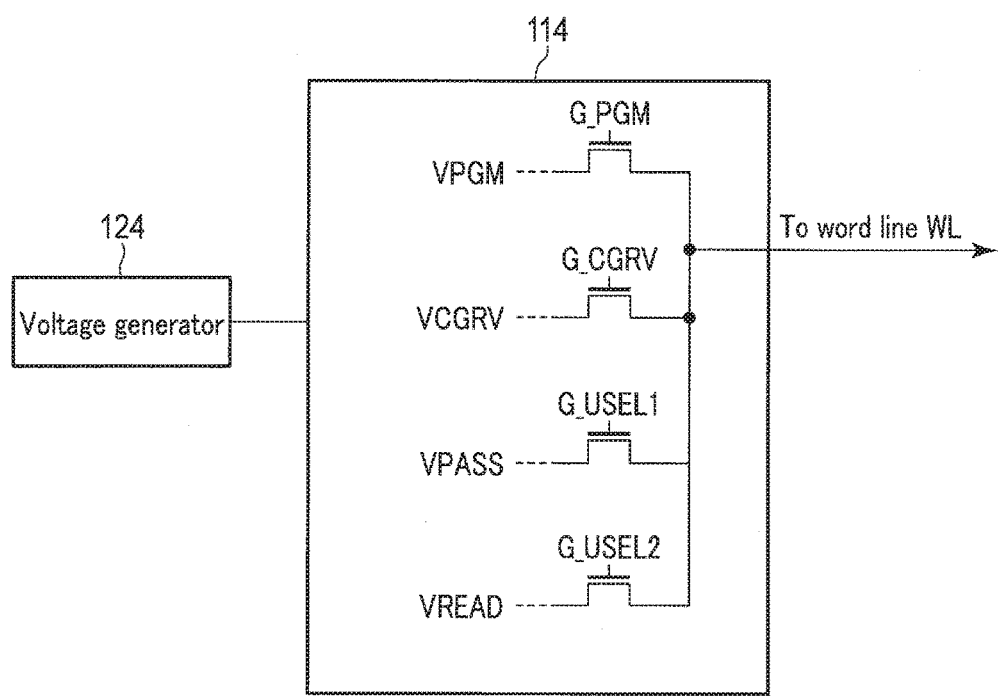
F I G. 7

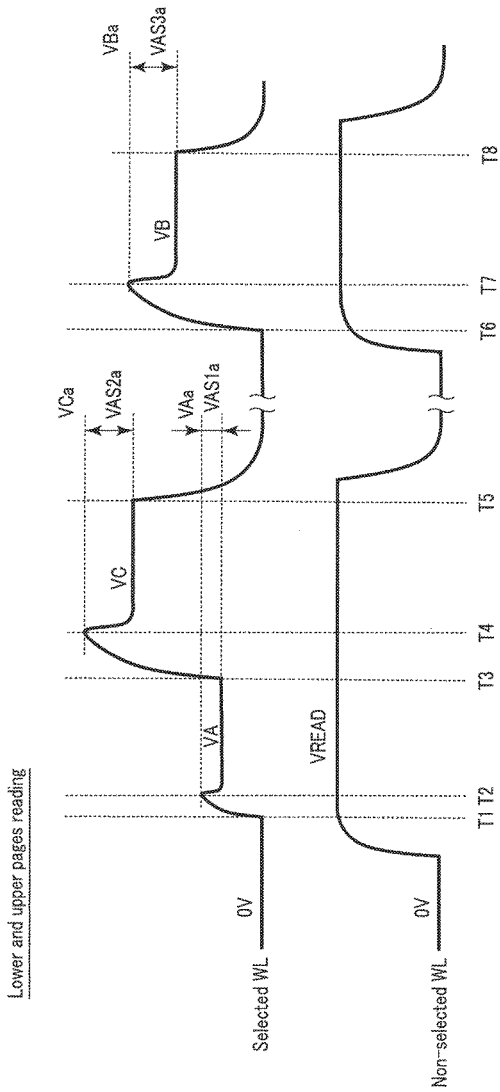
F I G. 10

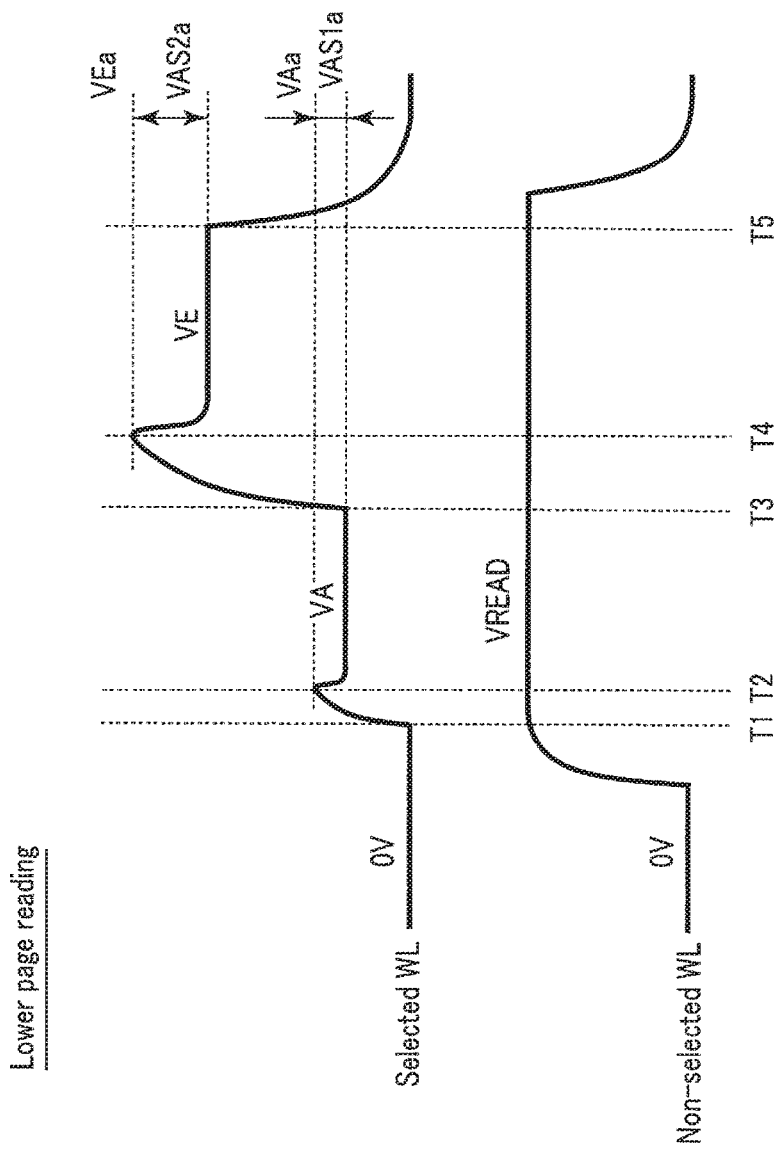
F I G. 12

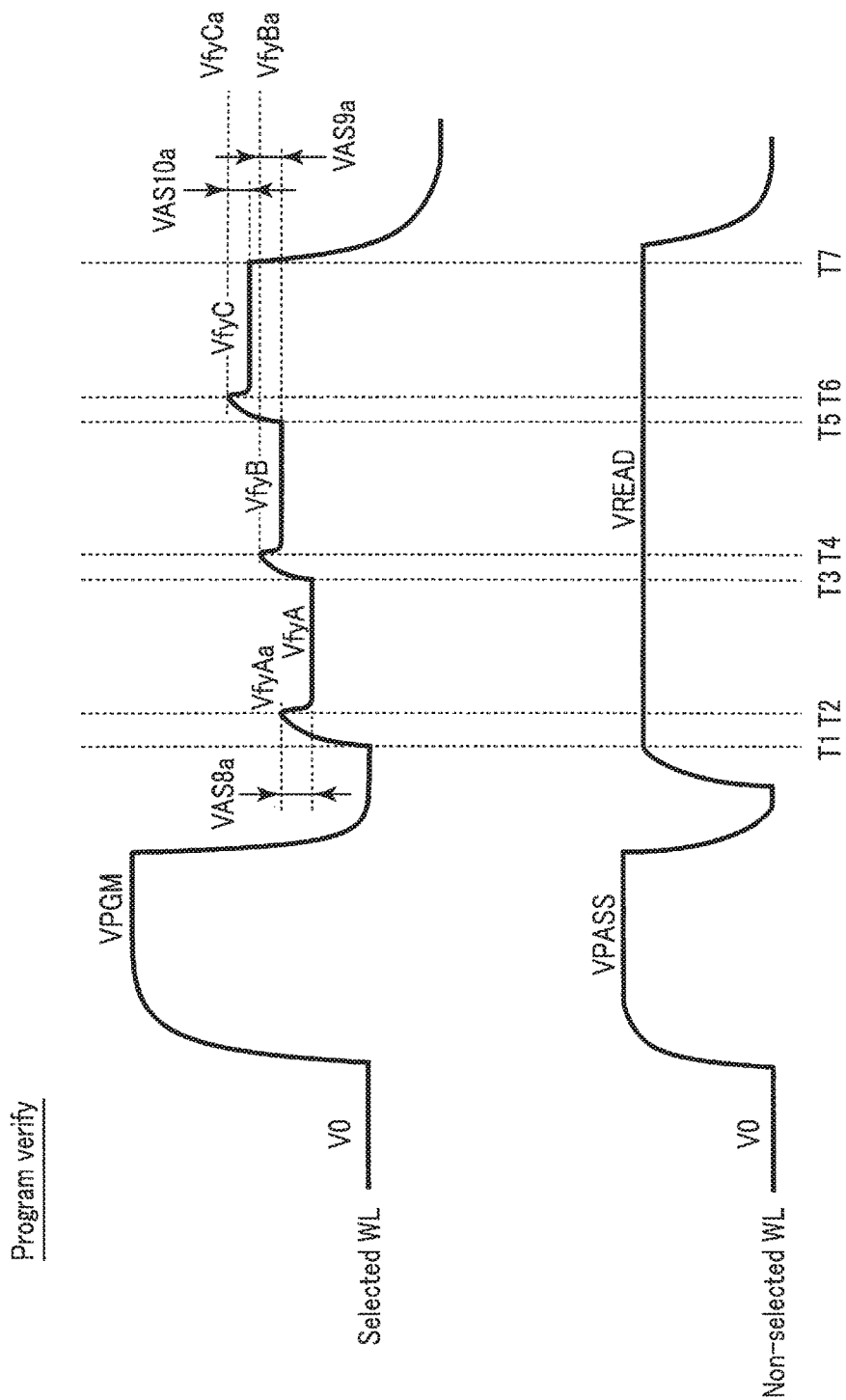
F I G. 15

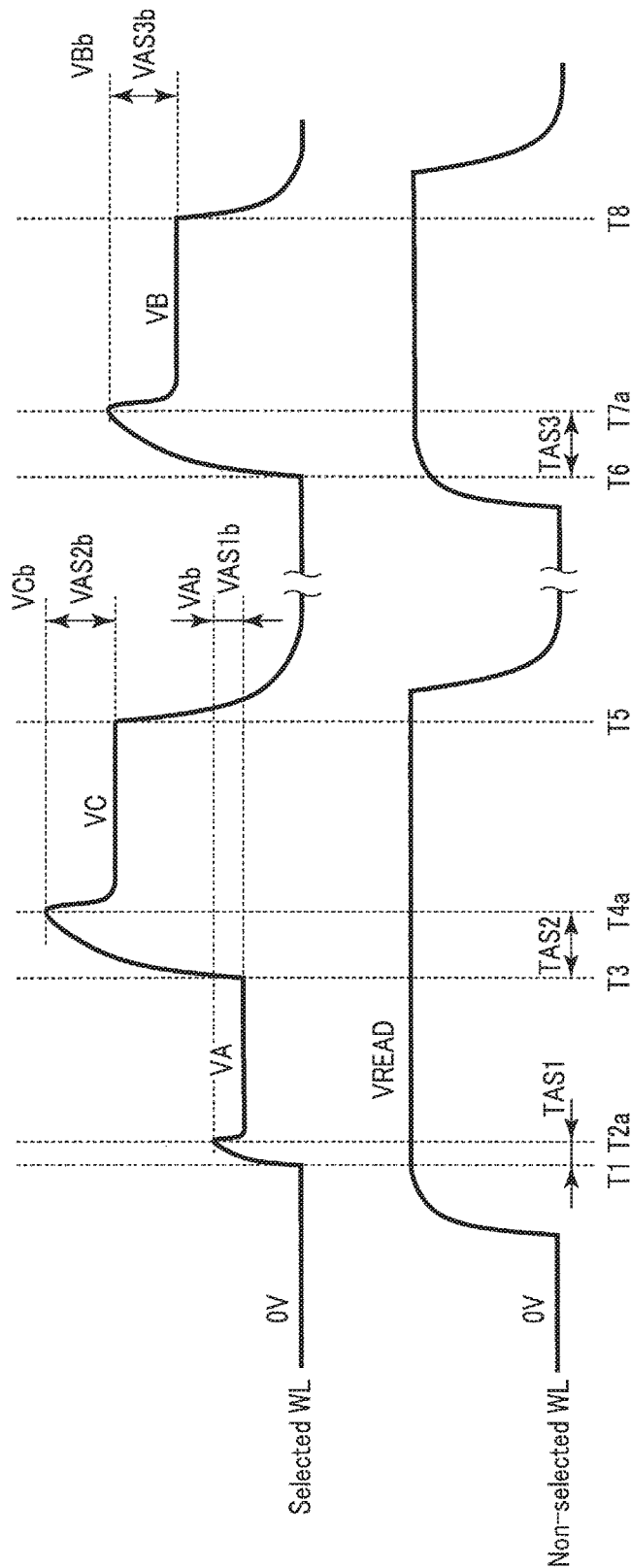
F I G. 20

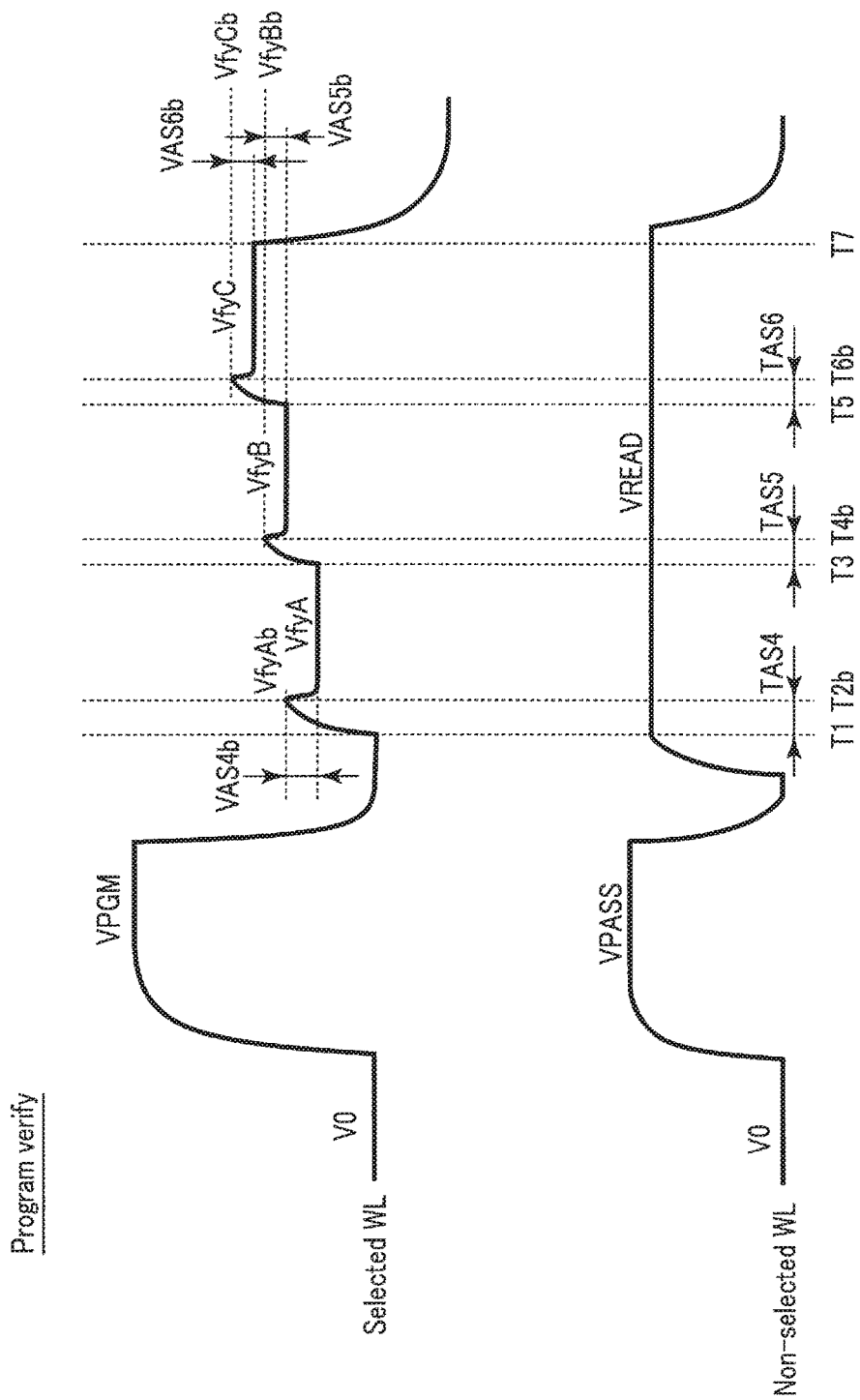
F I G. 21

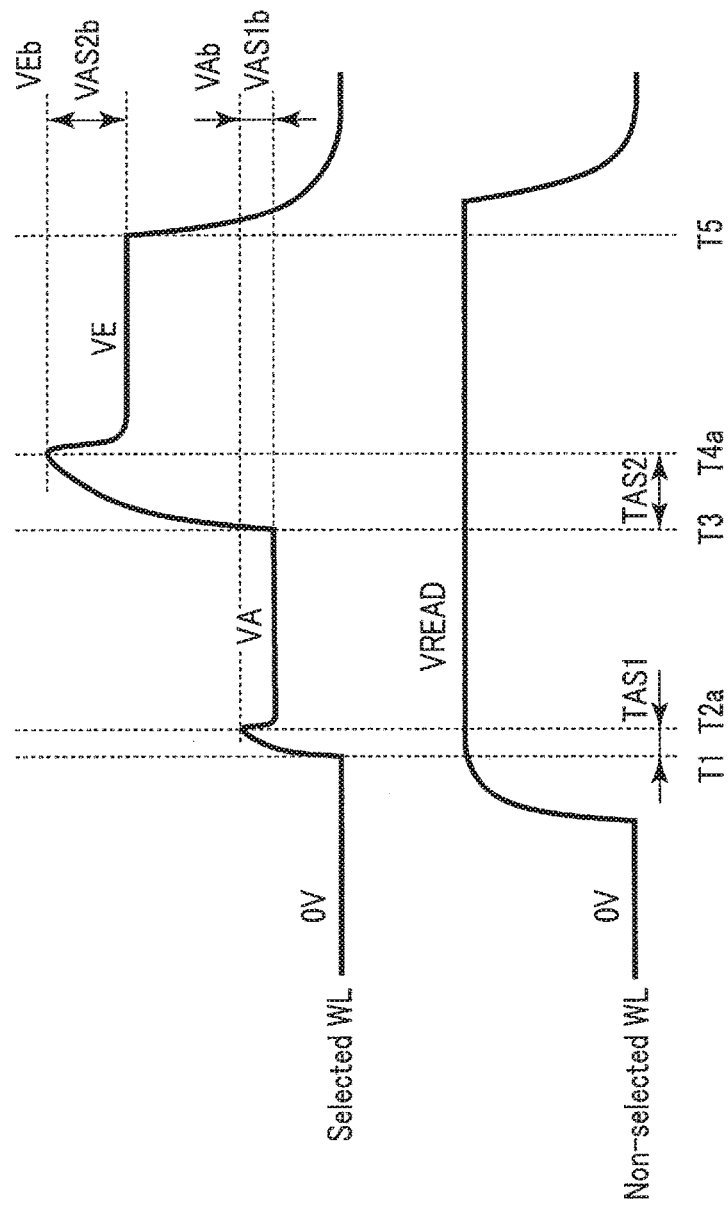
F I G. 22

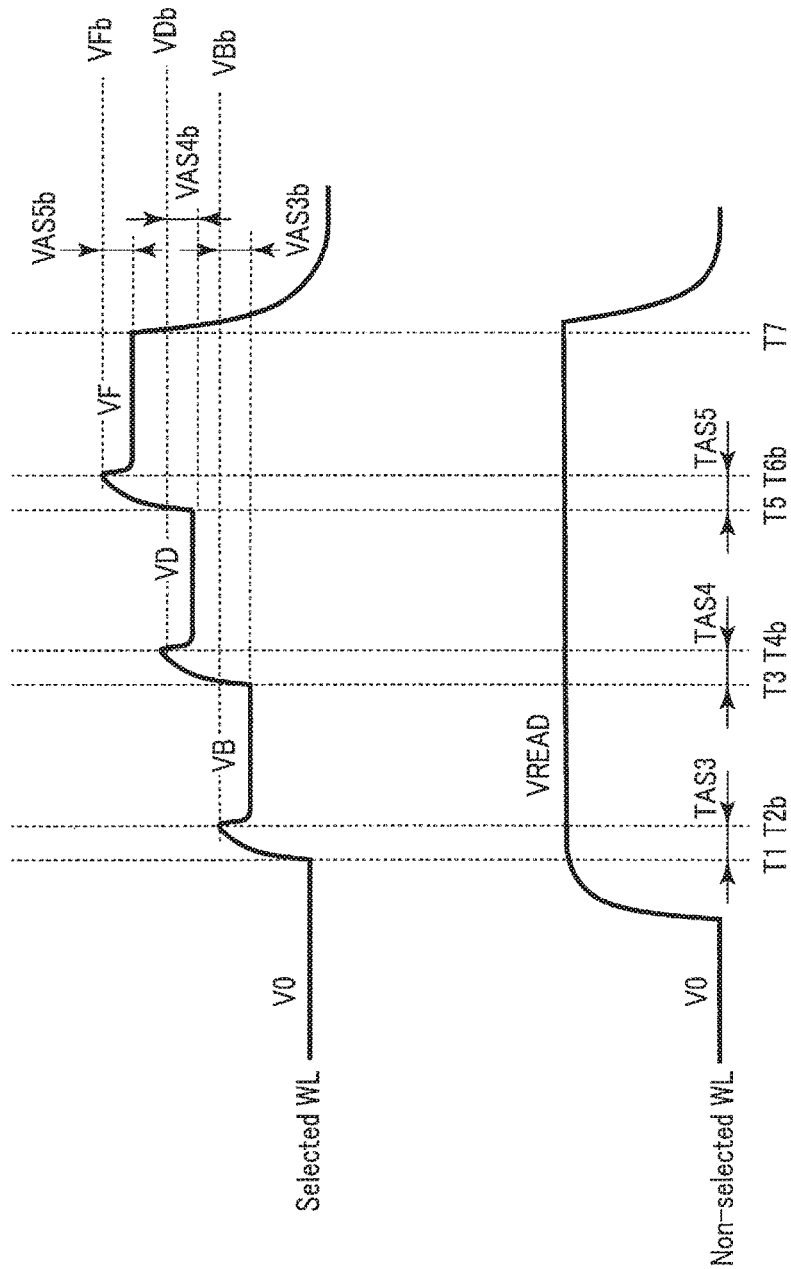
F I G. 23

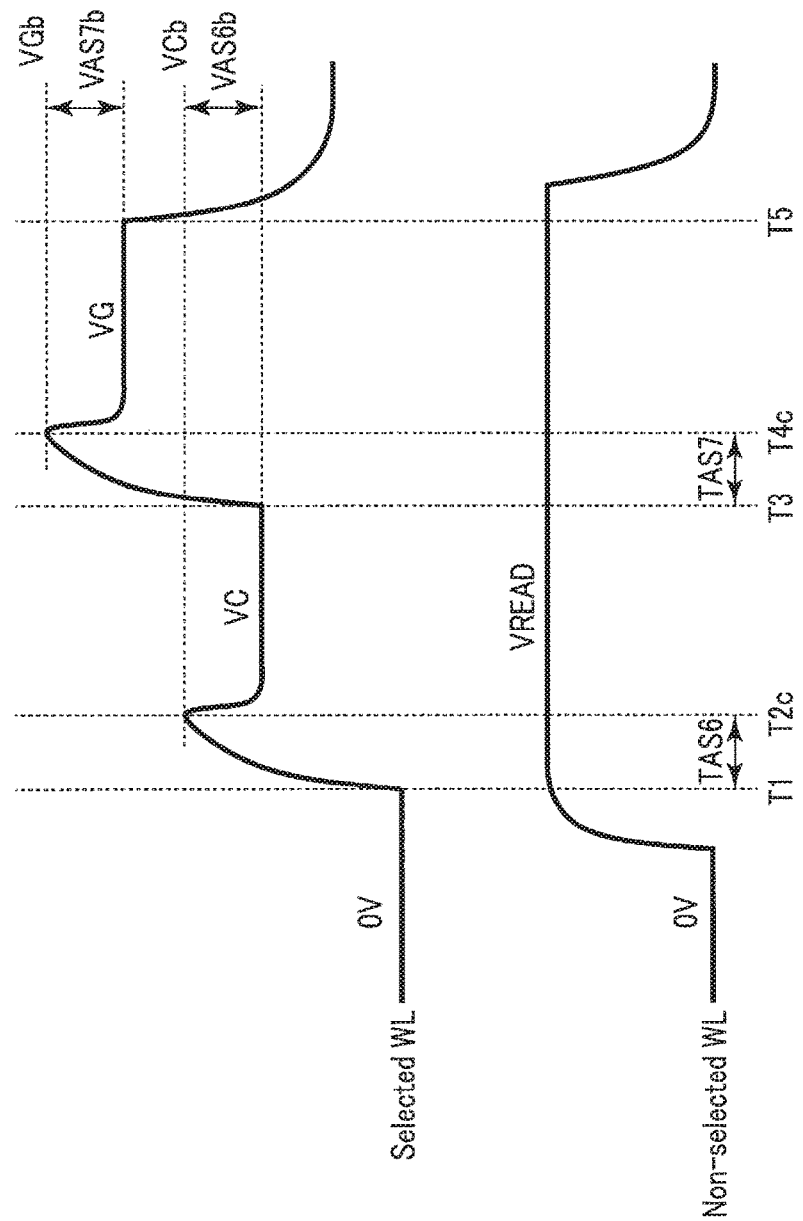
F I G. 24

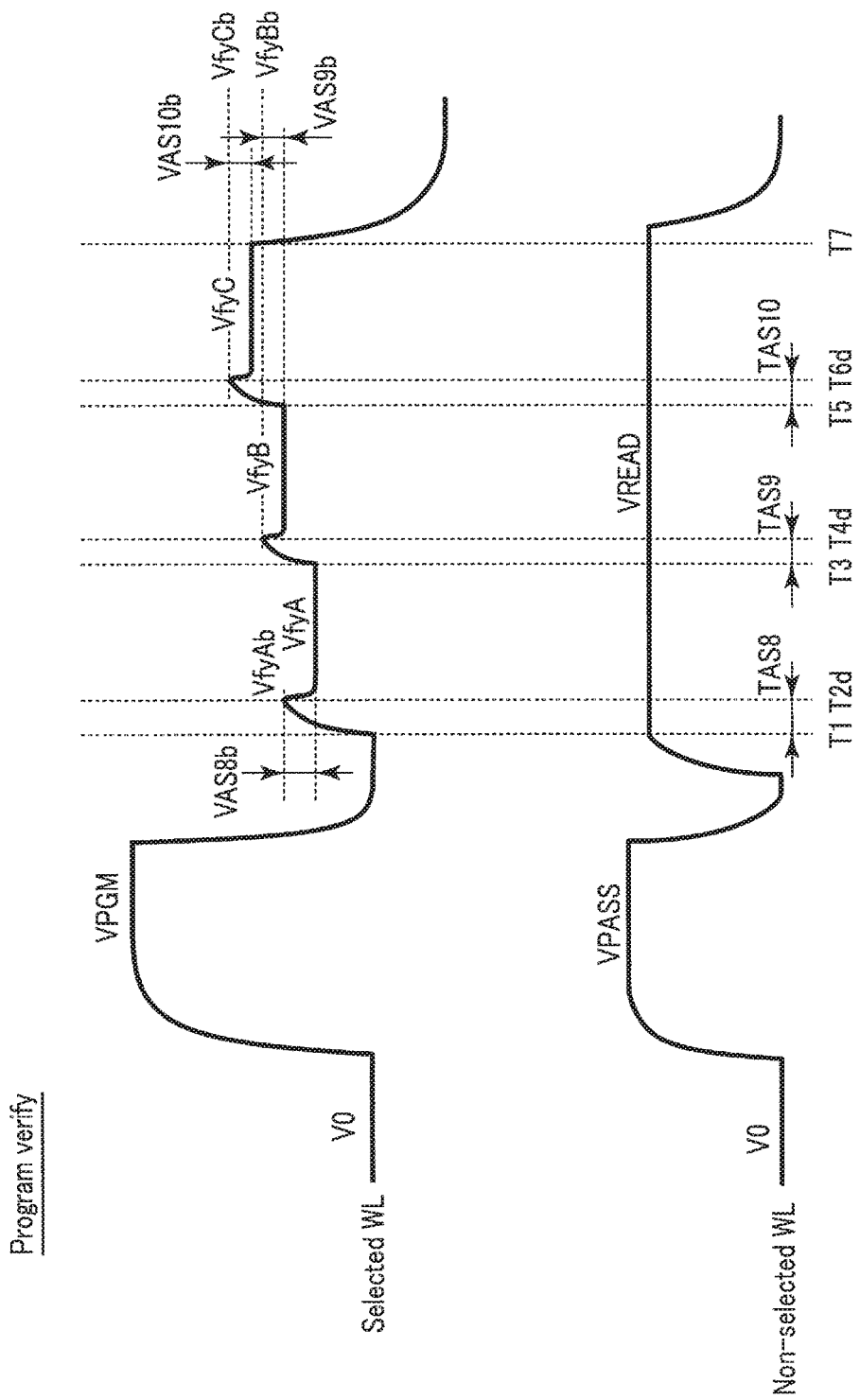
F I G. 25

SEMICONDUCTOR MEMORY DEVICE WHICH APPLIES MULTIPLE VOLTAGES TO THE WORD LINE

CROSS-REFERENCE TO RELATED APPLICATIONS

This application is based upon and claims the benefit of priority from the Japanese Patent Application NO. 2016-108783, filed May 31, 2016, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWING

FIG. 2 is a block diagram showing an overall configuration of the semiconductor memory device according to the embodiment;

FIG. 3 is a circuit diagram of blocks in the semiconductor memory device according to the embodiment;

FIG. 7 is a diagram showing the configuration of a driver in the semiconductor memory device according to the embodiment;

FIG. 10 is a diagram showing a first example of a word line charge operation during reading in the semiconductor memory device according to the first embodiment;

FIG. 12 is a diagram showing a second example of the word line charge operation during reading in the semiconductor memory device according to the first embodiment;

FIG. 15 is a diagram showing a second example of the word line charge operation during program verification in the semiconductor memory device according to the first embodiment;

FIG. 20 is a diagram showing a first example of the word line charge operation during reading in the semiconductor memory device according to the second embodiment;

FIG. 21 is a diagram showing a first example of the word line charge operation during program verification in the semiconductor memory device according to the second embodiment;

FIG. 22 is a diagram showing a second example of the word line charge operation during reading in the semiconductor memory device according to the second embodiment;

FIG. 23 is a diagram showing a third example of the word line charge operation during reading in the semiconductor memory device according to the second embodiment;

FIG. 24 is a diagram showing a fourth example of the word line charge operation during reading in the semiconductor memory device according to the second embodiment; and FIG. 25 is a diagram showing a second example of the word line charge operation during program verification in the semiconductor memory device according to the second embodiment;

DETAILED DESCRIPTION

Figure 1:
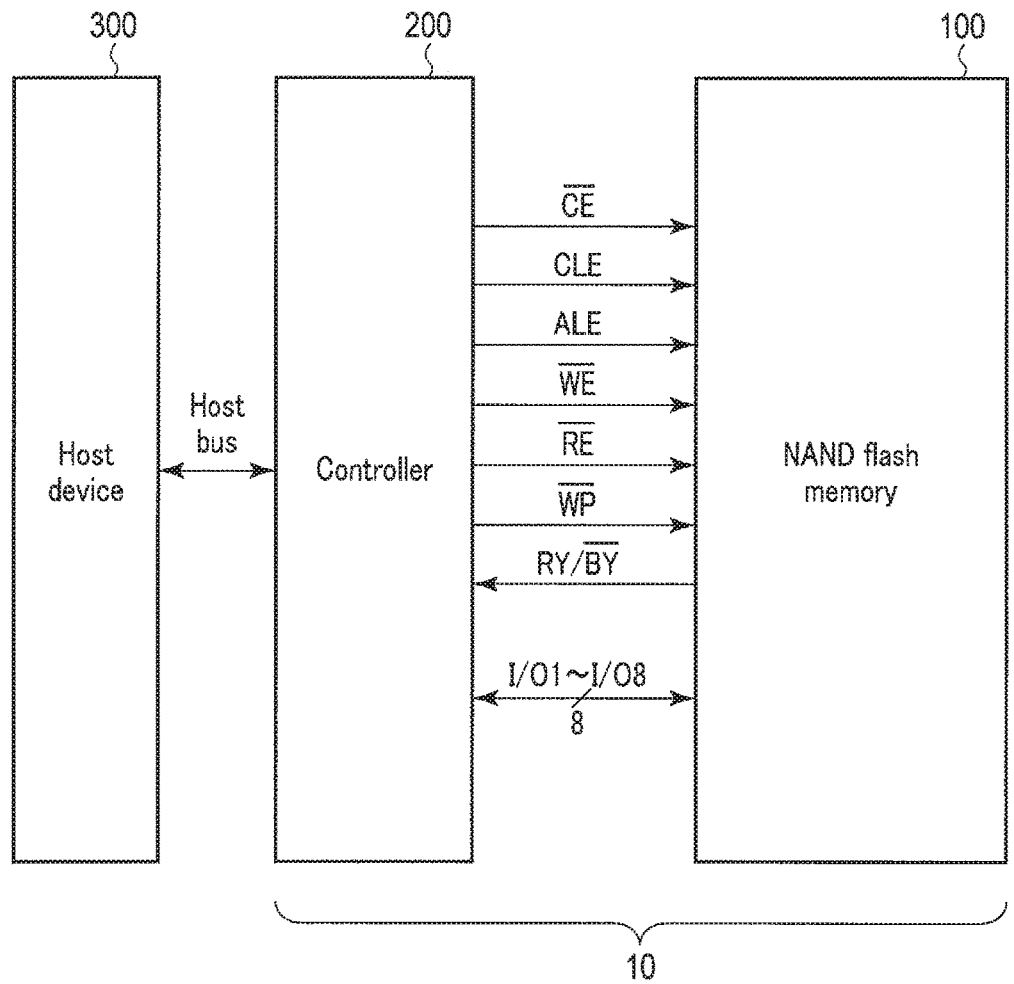
FIG. 1 is a block diagram showing a semiconductor memory device according to an embodiment and the configuration of a memory system including the semiconductor memory device.

In general, according to one embodiment, a semiconductor memory device includes a word line and a driver. The word line coupled to a memory cell. The driver is configured to apply a voltage to the word line. When a voltage applied to the word line is changed from a first voltage to a second voltage, the driver applies a third voltage according to a voltage difference between the first voltage and the second voltage to the word line.

Hereinafter, an embodiment will be described with reference to the drawings. In the description that follows, common reference numerals are attached to components having the same function and configuration. Here, a three-dimensionally stacked nonvolatile flash memory in which memory cell transistors are stacked upward on a semiconductor substrate is taken as an example of the semiconductor memory device.

First Embodiment

Hereinafter, a semiconductor memory device according to the present embodiment and a memory system including the semiconductor memory device will be described.

1. Configuration of Memory System

The configuration of a memory system will be described using FIG. 1. As shown in FIG. 1, a memory system 10 includes a semiconductor memory device, for example, a NAND flash memory 100 and a controller 200.

The NAND flash memory 100 includes a plurality of memory cells to store data in a nonvolatile manner. The configuration of the NAND flash memory 100 will be described below.

The controller 200 is connected to the NAND flash memory 100 by a NAND bus and connected to an external host device 300 by a host bus. The controller 200 controls the NAND flash memory 100 and also in response to an instruction received from the host device 300, instructs the NAND flash memory 100 to read, write, erase and so on.

The NAND bus transmits and receives signals conforming to a NAND interface. As these signals, for example, a chip enable signal /CE, a command latch enable signal CLE, an address latch enable signal ALE, a write enable signal /WE, a read enable signal /RE, and a write protect signal /WP are used.

The chip enable signal /CE is a signal to enable the NAND flash memory 100. The command latch enable signal CLE and the address latch enable signal ALE are signals to notify the NAND flash memory 100 that an input signal is a command or an address signal respectively. The write enable signal /WE and the read enable signal /RE are signals instructing the NAND flash memory 100 to input or output signals by, for example, input/output signals I/O1 to I/O8 respectively. The write protect signal /WP is a signal to put the NAND flash memory 100 into a protected state when, for example, power is turned on or off. A ready/busy signal RY/(/BY) is a signal that notifies the controller 200 whether the NAND flash memory 100 is in a ready state (instructions from the controller 200 are accepted) or a busy state (instructions from the controller 200 are not accepted). For example, the ready/busy signal RY/(/BY) is set to an "L" level (busy state) when the NAND flash memory 100 performs a data read operation or the like and set to an "H" level (ready state) when such an operation is completed.

An input/output signal I/O is, for example, an 8-bit signal. The input/output signal I/O is data transmitted and received between the NAND flash memory 100 and the controller 200 and is a command, an address, write data, read data, status information of the NAND flash memory 100 or the like.

2. Overall Configuration of Semiconductor Memory Device

An overall configuration example of the NAND flash memory 100 according to the present embodiment will be described using FIG. 2.

As shown in FIG. 2, the NAND flash memory 100 includes a memory unit 110 and a peripheral circuit 120.

The memory unit 110 includes a memory cell array 111, a row decoder 112, a sense amplifier 113, and a driver 114.

The memory cell array 111 includes a plurality of blocks BLK0, BLK1, . . . as a set of a plurality of nonvolatile memory cell transistors. Hereinafter, when a block BLK is written, it is assumed that each of the blocks BLK0, BLK1, . . . is indicated. The block BLK is, for example, the erasure unit of data and data in the same block BLK is collectively erased. Incidentally, the number of blocks in the memory cell array 111 is arbitrary.

The block BLK includes a plurality of string units SU0, SU1, SU2, SU3, . . . Each of the string units includes a plurality of NAND strings 116. The configuration in the block BLK will be described below.

The row decoder 112 selects the word line corresponding to the page to be written into or read from by decoding the address of the block BLK or the address of the page when, for example, data is written or read. The row decoder 112 also transfers an appropriate voltage to a selected word line WL, a non-selected word line WL, and selected gate lines SGD, SGS.

The sense amplifier 113 senses and amplifies data read from a memory cell transistor MT into a bit line BL when data is read. The sense amplifier 113 also transfers write data to the memory cell transistor MT when data is written. Data is read from or written into the memory cell array 111 in units of pages.

The driver 114 outputs a voltage needed for writing, reading, or erasing data to the row decoder 112, the sense amplifier 113, and a source line SL. The row decoder 112 and the sense amplifier 113 transfer a voltage supplied by the driver 114 to the memory cell transistor MT.

The peripheral circuit 120 includes a sequencer 121, a logic circuit 122, a register 123, and a voltage generator 124.

The sequencer 121 controls the operation of the NAND flash memory 100 as a whole.

The logic circuit 122 stores various kinds of information needed to control the operation of the NAND flash memory 100. For example, an assist voltage and an assist period described below are stored in the logic circuit 122. The assist voltage and the assist period will be described in detail below.

The register 123 holds various signals. For example, the register 123 holds the status of data writing or erase operation, thereby notifying the controller 200 outside of whether the operation is normally completed. Alternatively, the register 123 holds a command, an address or the like received from the controller 200 and can also hold information needed for writing or reading stored in the logic circuit 122 and various tables.

The voltage generator 124 generates a voltage needed to write, read, or erase data and supplies the needed voltage to the row decoder 112, the sense amplifier 113, and the driver 114.

2.1 Configuration of Memory Cell Array

Next, the configuration of the memory cell array 111 included in the NAND flash memory 100 will be described in detail.

2.1.1 Memory Cell Array Circuit

A circuit diagram of the block BLK (each of the blocks BLK0, BLK1, . . . ) in the memory cell array 111 is shown in FIG. 3.

As shown in FIG. 3, the block BLK includes, for example, four string units SU0, SU1, SU2, SU3. Further, each of the string units includes the plurality of NAND strings 116. Incidentally, the number of string units SU in one block BLK and the number of the NAND strings 116 in one string unit SU are arbitrary. Hereinafter, when the string unit SU is written, it is assumed that each of a plurality of string units SU0 to SU3 is indicated.

Each of the NAND strings 116 includes, for example, eight memory cell transistors MT0, MT1, . . . , MT7 and select transistors ST1, ST2. Incidentally, a dummy transistor may be provided between the memory cell transistor MT0 and the select transistor ST2 and between the memory cell transistor MT7 and the select transistor ST1. Hereinafter, when the memory cell transistor MT is written, it is assumed that each of the memory cell transistors MT0 to MT7 is indicated and when the select transistor ST is written, it is assumed that each of the select transistors ST1, ST2 is indicated.

The memory cell transistor MT includes a stack gate including a control gate and a charge storage layer and holds data in a nonvolatile manner. Incidentally, the memory cell transistor MT may be a MONOS (Metal-Oxide-Nitride-Oxide-Silicon) type using an insulating film for the charge storage layer or a FG (Floating Gate) type using a conductive film for the charge storage layer. In the present embodiment, an example in which the memory cell transistor MT is the MONOS type is shown. Further, the number of the memory cell transistors MT is not limited to eight and may be 16, 32, 64, 128 or the like and the number thereof is not to be limited. Further, the number of the select transistors ST1, ST2 is arbitrary.

The sources or drains of the memory cell transistors MT0 to MT7 are connected in series between the select transistors ST1, ST2. The drain of the memory cell transistor MT7 on one side of the series connection is connected to the source of the select transistor ST1 and the source of the memory cell transistor MT0 on the other side is connected to the drain of the select transistor ST2.

The gates of the select transistors ST1 of the string units SU0 to SU3 are connected to selected gate lines SGD0, SGD1, SGD2, SGD3 respectively. Hereinafter, when the selected gate line SGD is written, it is assumed that each of the selected gate lines SGD0 to SGD3 is indicated. The gates of the select transistors ST1 in the same string unit SU are connected in common to the same selected gate line SGD. On the other hand, the gates of the select transistors ST2 are connected in common to the same selected gate line SGS between a plurality of string units. Control gates of the memory cell transistors MT0 to MT7 in the same block are connected in common to word lines WL0 to WL7 respectively.

That is, while the word lines WL0 to WL7 and the selected gate line SGS are connected in common between a plurality of string units SU in the same block BLK, the selected gate line SGD is provided for each string unit SU even in the same block.

The drains of the select transistors ST1 of the NAND strings 116 in the same row of the NAND strings 116 arranged in a matrix shape in the memory cell array 111 are connected in common to any one of bit lines BL0, BL1, ..., BL(n−1). where n is a natural number equal to 1 or greater. Hereinafter, when the bit line BL is written, it is assumed that each of the bit lines BL0 to BL(n−1) is indicated. That is, the bit line BL is connected in common to the NAND strings 116 between the plurality of string units SU. Also, the sources of the select transistors ST2 are connected in common to the source line SL. That is, the source line SL is connected in common to, for example, the NAND strings 116 between the plurality of string units SU.

Data is collectively read from or written into a plurality of memory cell transistors MT connected in common to any word line WL in any string unit SU of any block BLK. This unit is called a "page".

Also, the erasure range of data is not limited to one block BLK and a plurality of blocks may collectively be erased or an area of a portion of one block BLK may collectively be erased. The erasure of data is described in described in U.S. patent application Ser. No. 12/694,690 filed on Jan. 27, 2010, entitled "Nonvolatile Semiconductor Memory Device". Also, the erasure of data is described in described in U.S. patent application Ser. No. 13/235,389 filed on Sep. 18, 2011, entitled "Nonvolatile Semiconductor Memory Device". The entire contents of these patent applications are incorporated herein by reference.

2.1.2 Structure of the Memory Cell Array

A sectional structure of a partial area of the memory cell array 111 in the present embodiment will be described using FIG. 4.

Figure 4:
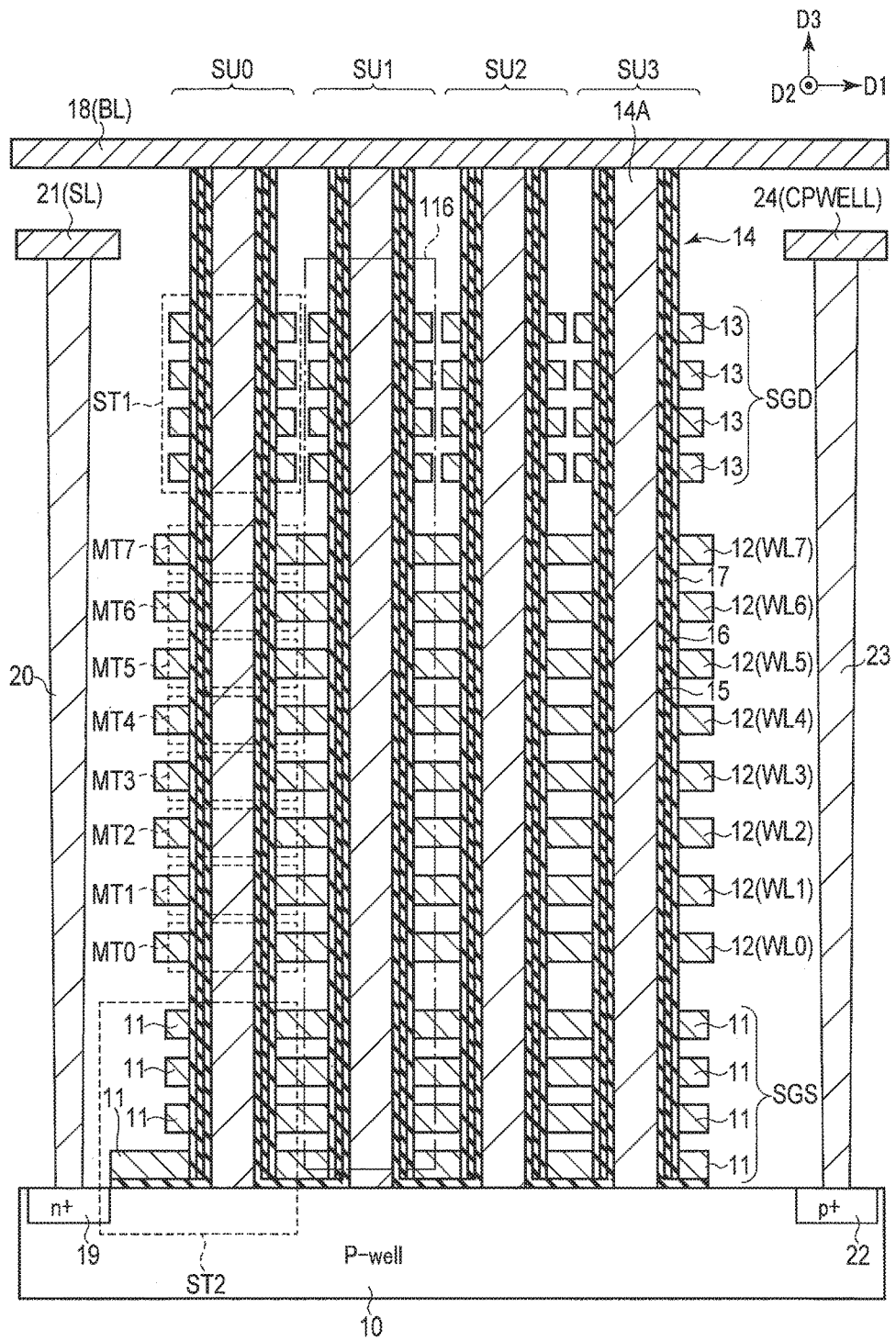
FIG. 4 is a sectional view of a memory cell array in the semiconductor memory device according to the embodiment.

As illustrated in FIG. 4, the plurality of NAND strings 116 is provided over a p-type well region 10. That is, a plurality of wiring layers 11 functioning as the selected gate line SGS, a plurality of wiring layers 12 functioning as the word line WL, and a plurality of wiring layers 13 functioning as the selected gate line SGD are provided in a D3 direction over the well region 10.

A memory hole 14 reaching the well region 10 by passing through these wiring layers 11, 12, 13 is formed. A gate insulating film 15, a charge storage layer (for example, an insulating film) 16, and a block insulating film 17 are successively provided on the side face of the memory hole 14. Further, a semiconductor layer (or a conductive layer) 14A is embedded in the memory hole 14. The semiconductor layer 14A is an area that functions as a current path of the NAND string 116 and in which a channel is formed when the memory cell transistor MT and the select transistor ST operate.

The plurality (four layers in this example) of wiring layers 11 provided in each of the NAND strings 116 is electrically connected in common to the same selected gate line SGS. That is, the wiring layers 11 of the four layers function substantially as a gate electrode of one select transistor ST2. This also applies to the select transistor ST1 (selected gate line SGD of four layers).

With the above configuration, the select transistor ST2, the plurality of memory cell transistors MT, and the select transistor ST1 are successively stacked over the well region 10 in each of the NAND strings 116.

A wiring layer 18 functioning as the bit line BL is provided at the upper end of the semiconductor layer 14A. The bit line BL extends in a D1 direction and is connected to the sense amplifier 113.

Further, an $n^+$-type impurity diffusion layer 19 and a $p^+$-type impurity diffusion layer 22 are provided in the surface of the well region 10. A contact plug 20 is provided on the diffusion layer 19 and a wiring layer 21 functioning as the source line SL is provided on the contact plug 20. The source line SL extends in a D2 direction. Also, a contact plug 23 is provided on the diffusion layer 22 and a wiring layer 24 functioning as a well wire CPWELL is provided on the contact plug 23. The wiring layers 21, 24 are layers above the wiring layer 13 (selected gate line SGD) and are also formed below the wiring layer 18.

A plurality of the configurations described above is arranged in a direction (D2 direction) in a depth direction of the paper on which FIG. 4 is printed and the string unit SU is formed by a set of the plurality of NAND strings 116 arranged in the depth direction. Also, the wiring layers 11 functioning as a plurality of selected gate lines SGS contained in the same block are connected mutually in common. That is, the gate insulating film 15 is formed also over the well region 10 between the NAND strings 116 adjacent to each other and the wiring layer 11 and the gate insulating film 15 adjacent to the diffusion layer 19 are formed up to the neighborhood of the diffusion layer 19.

Therefore, a channel formed in the select transistor ST2 when the select transistor ST2 is turned on electrically connects the memory cell transistor MT0 and the diffusion layer 19. Also, a potential can be provided to the semiconductor layer 14A by applying a voltage to the wiring layer (CPWELL) 24. In FIG. 4, an interlayer insulating film provided between the p-type well region 10 and the wiring layer 18 is omitted.

Incidentally, the memory cell array 111 may also adopt other configurations. The configuration of the memory cell array of a three-dimensionally stacked nonvolatile semiconductor memory is described in, for example, U.S. patent application Ser. No. 12/407,403 filed on Mar. 19, 2009, entitled "Three-Dimensionally Stacked Nonvolatile Semiconductor Memory". Also, the configuration thereof is described in U.S. patent application Ser. No. 12/406,524 filed on Mar. 18, 2009, entitled "Three-Dimensionally Stacked Nonvolatile Semiconductor Memory", U.S. patent application Ser. No. 13/816,799 filed on Sep. 22, 2011, entitled "Nonvolatile Semiconductor Memory Device", and U.S. patent application Ser. No. 12/532,030 filed on Mar. 23, 2009, entitled "Semiconductor Memory and Manufacturing Method of the Same". The entire contents of these patent applications are incorporated herein by reference.

2.1.2.1 Threshold Distribution of the Memory Cell Transistor

Figure 5:
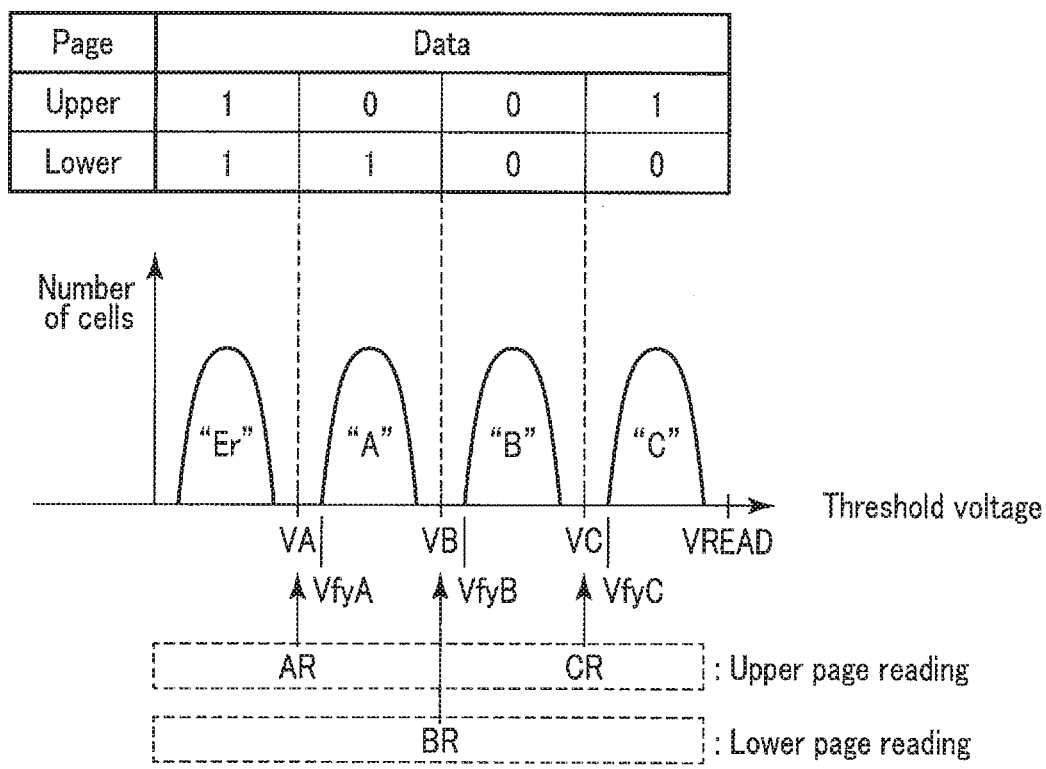
FIG. 5 is a diagram showing data and threshold distributions that can be assumed by a memory cell transistor in the semiconductor memory device according to the embodiment.

FIG. 5 shows data and threshold distributions that can be assumed by the memory cell transistor MT in the present embodiment.

As illustrated in FIG. 5, each memory cell transistor MT can hold, for example, 2-bit data in accordance with the threshold thereof. The 2-bit data is, for example, "1", "01", "00", and "10" in ascending order of threshold.

The threshold of the memory cell holding the "11" data is an "Er" level. The Er level is a threshold in a state in which charges in the charge storage layer are extracted and data is erased, and is a positive or negative value (for example, less than a voltage VA).

"01", "00", and "10" have thresholds in a state in which data is written by injecting charges into the charge storage layer. The threshold of the memory cell holding the "01" data is an "A" level, which is higher than the Er level (for example, equal to the voltage VA or more and less than VB and VA<VB). The threshold of the memory cell holding the "00" data is a "B" level, which is higher than the A level (for example, equal to the voltage VB or more and less than VC and VB<VC). The threshold of the memory cell holding the "10" data is a "C" level, which is higher than the B level (for example, equal to the voltage VC or more).

However, the relationship between 2-bit data and the threshold is not limited to the above relationship and the relationship therebetween can appropriately be selected.

2-bit data held by each of the memory cell transistors MT is called a lower bit and an upper bit from the low-order bit. Then, a set of lower bits held by memory cell transistors connected to the same word line is called a lower page and a set of upper bits is called an upper page. Data may be written and read in units of the page (the writing method and reading method are called page-by-page writing and page-by-page reading respectively).

Figure 6:
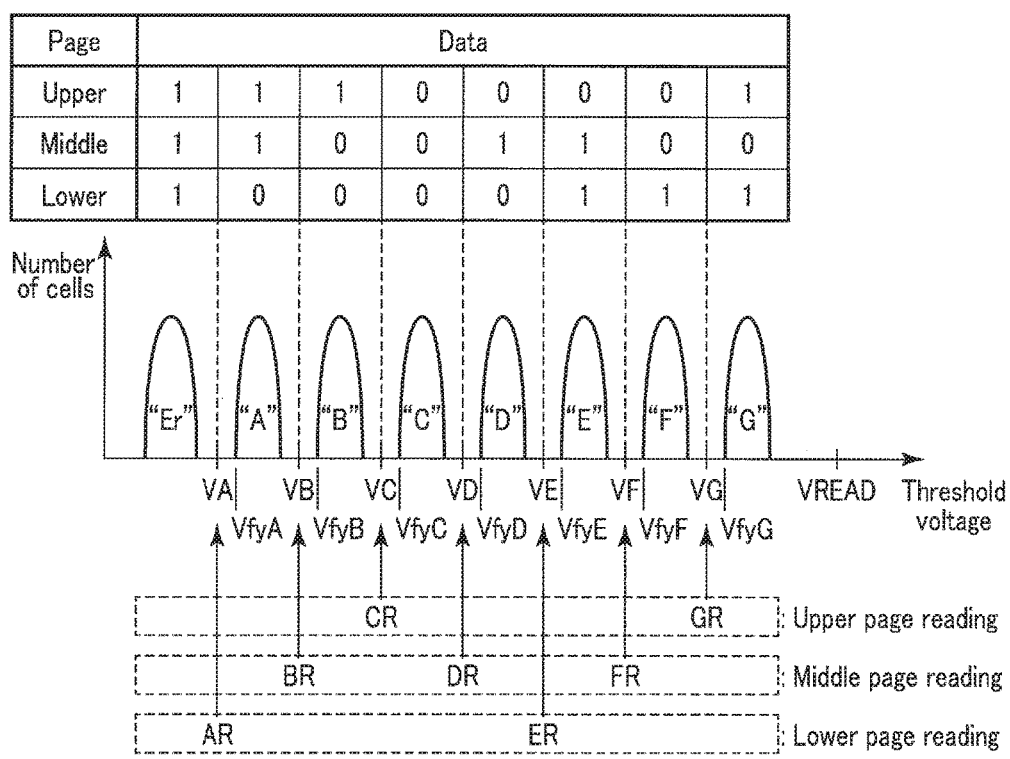
FIG. 6 is a diagram showing data and threshold distributions that can be assumed by another memory cell transistor in the semiconductor memory device according to the embodiment.

FIG. 6 shows data and threshold distributions that can be assumed by another memory cell transistor MT in the present embodiment.

As illustrated in FIG. 6, each memory cell transistor MT can hold, for example, 3-bit data in accordance with the threshold thereof. The 3-bit data is, for example, "111", "110", "100", "000", "010", "011", "001", and "101" in ascending order of threshold. The thresholds of memory cells holding the data are the Er level (for example, less than a voltage VA), the "A" level (for example, equal to the voltage VA or more and less than VB and VA<VB), the "B" level (for example, equal to the voltage VB or more and less than VC and VB<VC), the "C" level (for example, equal to the voltage VC or more and less than VD and VC<VD), a "D" level (for example, equal to the voltage VD or more and less than VE and VD<VE), an "E" level (for example, equal to the voltage VE or more and less than VF and VE<VF), an "F" level (for example, equal to the voltage VF or more and less than VG and VF<VG), and a "G" level (for example, equal to a voltage VG or more).

However, the relationship between 3-bit data and the threshold is not limited to the above relationship and the relationship therebetween can appropriately be selected.

3-bit data held by each of the memory cell transistors MT is each called a lower bit, a middle bit, and an upper bit from the low-order bit. Then, a set of lower bits held by memory cells connected to the same word line is called a lower page, a set of middle bits is called a middle page, and a set of upper bits is called an upper page. Data may be written and read in units of the page (the writing method and reading method are called page-by-page writing and page-by-page reading respectively).

1.2 Voltage Generator and Driver

The driver 114 included in the present embodiment will be described using FIG. 7.

As illustrated in FIG. 7, the voltage generator 124 supplies voltages applied to the word line WL in a read operation or a program or a program verification operation, for example, a voltage VPGM, a voltage VCGRV, a voltage VPASS, and a voltage VREAD to the driver 114.

The driver 114 includes a MOS transistor that transfers the voltage VPGM, the voltage VCGRV, the voltage VPASS, and the voltage VREAD to a predetermined word line WL. When the sequencer 121 sets the voltage level of a signal G_PGM to "H", the driver 114 supplies the voltage VPGM to the selected word line WL via the row decoder 112. Similarly, when the sequencer 121 sets the voltage level of a signal G_CGRV to "H", the driver 114 supplies the voltage VCGRV to the selected word line WL via the row decoder 112. When the sequencer 121 sets the voltage level of each of a signal G_USEL1 and a signal G_USEL2 to "H", the driver 114 supplies the voltage VPASS and the voltage VREAD to the word line WL via the row decoder 112 respectively. The voltage VCGRV is set to the voltages VA to VG during read operation and to the voltages VfyA to VfyG during program verification operation.

2. Operation of Semiconductor Memory Device

An operation to cause the word line voltage to transition at high speed when the transition of voltage of the word line WL is caused in a read operation or program verification operation in the NAND flash memory 100 will be described. Causing the word line voltage to transition indicates that the voltage of a word line is changed by charging or discharging the word line.

It is assumed that the voltage of the word line WL immediately before the transition of the voltage is caused (hereinafter, denoted as a pre-transition voltage, a pre-charge voltage, or a pre-discharge voltage) is V1 and the voltage of the word line WL of the transition target (hereinafter, denoted as a target voltage) is V2.

In the description that follows, the voltage of an area portion of the word line WL in an area where the current path length from the driver 114 (or the row decoder 112) to the word line WL is short (hereinafter, a word line area WLne) is denoted as Vne and the voltage of an area portion of the word line WL in an area where the current path length from the driver 114 to the word line WL is long (hereinafter, a word line area WLfa) is denoted as Vfa. Also, an applied voltage applied from the driver 114 to the word line WL is denoted as Vdr. The current path length from the driver 114 to the word line WL will be described in detail in the section of "Effect of the First Embodiment" described below.

2.1 Transition Operation of the Word Line Voltage (Assist Voltage Variable)

Cases in which the target voltage V2 of the word line WL is higher and lower than the pre-transition voltage V1 of the word line WL will be separately described and further, cases in which the difference between the pre-transition voltage V1 and the target voltage V2 is large and small will be separately described.

2.1.1 when the Target Voltage V2 is Higher than the Pre-Transition Voltage V1

An operation to charge the pre-transition voltage V1 of the word line WL to the target voltage V2, which is higher than the voltage V1, will be described.

Figure 8A:
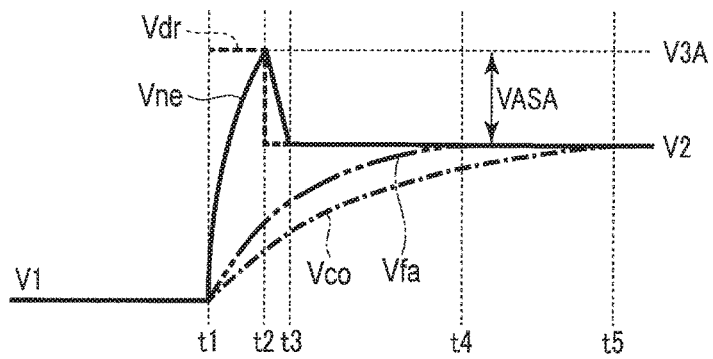
FIGS. 8A and 8B are diagrams showing a transition operation of a word line voltage in the semiconductor memory device according to a first embodiment.

2.1.1.1 when the Difference Between the Pre-Charge Voltage V1 and the Target Voltage V2 is Large FIG. 8A shows an applied voltage Vdr when the voltage difference between the pre-charge voltage V1 and the target voltage V2 of the word line WL is large and voltages Vne, Vfa changed depending on the applied voltage Vdr. Incidentally, each of times t1, t2, t3, t4, t5 in diagrams in FIG. 8A and thereafter does not indicate the same time and indicates any time in each diagram.

As shown in FIG. 8A, the driver 114 applies a voltage V3A as the applied voltage Vdr to the word line WL from time t1 to time t2. The voltage V3A is a voltage obtained by adding an assist voltage VASA to the target voltage V2.

More specifically, the logic circuit 122 stores information (hereinafter, first voltage information) indicating the assist voltage VASA (or the voltage V3A) in accordance with the voltage difference between the pre-charge voltage V1 and the target voltage V2. The sequencer 121 causes the register 123 to temporarily hold the first voltage information. The sequencer 121 controls the voltage generator 124 and the driver 114 based on the first voltage information. Then, the voltage generator 124 and the driver 114 apply the voltage V3A to the word line WL based on the control of the sequencer 121. That is, the sequencer 121 applies the voltage V3A, which is higher than the target voltage V2 by the assist voltage VASA in accordance with the voltage difference between the pre-charge voltage V1 and the target voltage V2, to the word line WL through the driver 114. For example, the sequencer 121 applies a voltage higher than the target voltage V2 by ½, ¼, or ⅛ of the voltage difference between the pre-charge voltage V1 and the target voltage V2 to the word line WL. Accordingly, the voltage Vne of the word line area WLne of the word line WL rises from the voltage V1 (time t1) to the voltage V3A (time t2).

Next, after time t2 passes, the driver 114 applies the target voltage V2 as the applied voltage Vdr to the word line WL. Accordingly, the voltage Vne falls from the voltage V3A to become the target voltage V2 at time t3.

On the other hand, in contrast to the voltage Vne, the voltage Vfa of the word line area WLfa of the word line WL gradually rises from the voltage V1 (time t1) to the voltage V2 (time t4). The voltage Vfa is lower than the voltage V2 at times t2, t3 and reaches the voltage V2 at time t4.

In FIG. 8A, as a comparative example, a voltage of the word line area WLfa when the target voltage V2 is applied from time t1 to time t5 without applying the voltage V3A to the word line WL from time t1 to time t2 was indicated by Vco. The voltage Vco rises more gradually than the voltage Vfa from the voltage V1 (time t1) to the voltage V2 (time t5).

The voltage Vfa rises faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 8A, the voltage V3A obtained by adding the assist voltage VASA to the target voltage V2 is applied to the word line WL from time t1 to time t2. The assist voltage VASA is set by the sequencer 121 in accordance with the voltage difference between the pre-charge voltage V1 and the target voltage V2. The rise of the voltage Vfa is made faster than that of the voltage Vco by applying the voltage V3A to the word line WL.

Accordingly, the voltage Vne and the voltage Vfa of the word line WL are set to the target voltage V2 at high speed.

Figure 8B:
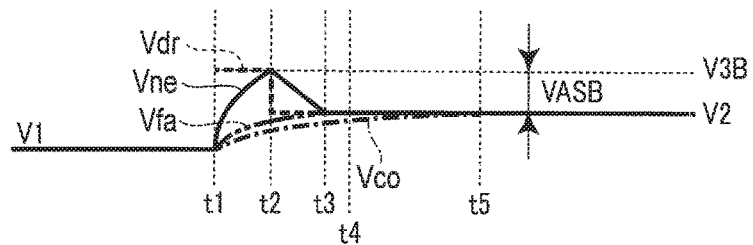

2.1.1.2 when the Difference Between the Pre-Charge Voltage V1 and the Target Voltage V2 is Small FIG. 8B shows the applied voltage Vdr when the voltage difference between the pre-charge voltage V1 and the target voltage V2 of the word line WL is small and the voltages Vne, Vfa changed depending on the applied voltage Vdr.

As shown in FIG. 8B, the driver 114 applies a voltage V3B as the applied voltage Vdr to the word line WL from time t1 to time t2. The voltage V3B is a voltage obtained by adding an assist voltage VASB to the target voltage V2. The assist voltage VASB is lower than the assist voltage VASA. The period (from time t1 to tim2) in which the voltage V3B is applied may be the same as the period in which the voltage V3A is applied in FIG. 8A or may be different therefrom.

More specifically, the logic circuit 122 stores information (hereinafter, second voltage information) indicating the assist voltage VASB (or the voltage V3B) in accordance with the voltage difference between the pre-charge voltage V1 and the target voltage V2. The sequencer 121 causes the register 123 to temporarily hold the second voltage information. The sequencer 121 controls the voltage generator 124 and the driver 114 based on the second voltage information. Then, the voltage generator 124 and the driver 114 apply the voltage V3B to the word line WL based on the control of the sequencer 121. That is, the sequencer 121 applies the voltage V3B, which is higher than the target voltage V2 by the assist voltage VASB in accordance with the voltage difference between the pre-charge voltage V1 and the target voltage V2, to the word line WL by the driver 114. For example, the sequencer 121 applies a voltage higher than the target voltage V2 by ½, ¼, or ⅛ of the voltage difference between the pre-charge voltage V1 and the target voltage V2 to the word line WL. Accordingly, the voltage Vne of the word line area WLne of the word line WL rises from the voltage V1 (time t1) to the voltage V3B (time t2).

Next, after time t2 passes, the driver 114 applies the target voltage V2 as the applied voltage Vdr to the word line WL. Accordingly, the voltage Vne falls from the voltage V3B to become the target voltage V2 at time t3.

On the other hand, in contrast to the voltage Vne, the voltage Vfa of the word line area WLfa of the word line WL gradually rises from the voltage V1 (time t1) to the voltage V2 (time t4).

In FIG. 8B, as a comparative example, a voltage of the word line area WLfa when the target voltage V2 is applied from time t1 to time t5 without applying the voltage V3B to the word line WL from time t1 to time t2 was indicated by Vco. The voltage Vco rises more gradually than the voltage Vfa from the voltage V1 (time t1) to the voltage V2 (time t5).

The voltage Vfa rises faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 8B, the voltage V3B obtained by adding the assist voltage VASB to the target voltage V2 is applied to the word line WL from time t1 to time t2. The assist voltage VASB is set by the sequencer 121 to a voltage lower than the assist voltage VASA in accordance with the voltage difference between the pre-charge voltage V1 and the target voltage V2. The rise of the voltage Vfa is made faster than that of the voltage Vco by applying the voltage V3B to the word line WL. Accordingly, the voltage Vne and the voltage Vfa of the word line WL are set to the target voltage V2 at high speed.

2.1.2 when the Target Voltage V2 is Lower than the Pre-Transition Voltage V1

An operation to discharge the pre-transition voltage V1 of the word line WL to the target voltage V2, which is lower than the voltage V1, will be described. An operation similar to the operation when the target voltage V2 is higher than the pre-transition voltage V1 described above is omitted.

Figure 9A:
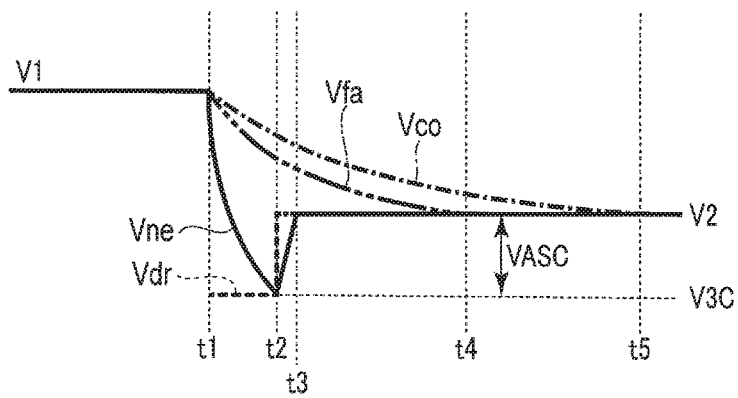
FIGS. 9A and 9B are diagrams showing the transition operation of another word line voltage in the semiconductor memory device according to the first embodiment.

2.1.2.1 when the Difference Between a Pre-Discharge Voltage V1 and the Target Voltage V2 is Large FIG. 9A shows an applied voltage Vdr when the voltage difference between the pre-discharge voltage V1 and the target voltage V2 of the word line WL is large and voltages Vne, Vfa changed depending on the applied voltage Vdr.

As shown in FIG. 9A, the driver 114 applies a voltage V3C as the applied voltage Vdr to the word line WL from time t1 to time t2. The voltage V3C is a voltage lower than the target voltage V2 by an assist voltage VASC.

More specifically, the logic circuit 122 stores information (hereinafter, third voltage information) indicating the assist voltage VASC (or the voltage V3C) in accordance with the voltage difference between the pre-discharge voltage V1 and the target voltage V2. The sequencer 121 controls the voltage generator 124 and the driver 114 based on the third voltage information. Then, the voltage generator 124 and the driver 114 apply the voltage V3C to the word line WL based on the control of the sequencer 121. That is, the sequencer 121 applies the voltage V3C, which is lower than the target voltage V2 by the assist voltage VASC in accordance with the voltage difference between the pre-charge voltage V1 and the target voltage V2, to the word line WL by the driver 114. For example, the sequencer 121 applies a voltage lower than the target voltage V2 by ½, ¼, or ⅛ of the voltage difference between the pre-discharge voltage V1 and the target voltage V2 to the word line WL. Accordingly, the voltage Vne of the word line area WLne of the word line WL falls from the voltage V1 (time t1) to the voltage V3C (time t2).

Next, after time t2 passes, the driver 114 applies the target voltage V2 as the applied voltage Vdr to the word line WL. Accordingly, the voltage Vne rises from the voltage V3C to become the target voltage V2 at time t3.

On the other hand, in contrast to the voltage Vne, the voltage Vfa of the word line area WLfa of the word line WL gradually falls from the voltage V1 (time t1) to the voltage V2 (time t4). The voltage Vfa is higher than the voltage V2 at times t2, t3 and reaches the voltage V2 at time t4.

In FIG. 9A, as a comparative example, a voltage of the word line area WLfa when the target voltage V2 is applied from time t1 to time t5 without applying the voltage V3C to the word line WL from time t1 to time t2 was indicated by Vco. The voltage Vco falls more gradually than the voltage Vfa from the voltage V1 (time t1) to the voltage V2 (time t5).

The voltage Vfa falls faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 9A, the voltage V3C, which is lower than the target voltage V2 by the assist voltage VASC, is applied to the word line WL from time t1 to time t2. The assist voltage VASC is set by the sequencer 121 in accordance with the voltage difference between the pre-discharge voltage V1 and the target voltage V2. The fall of the voltage Vfa is made faster than that of the voltage Vco by applying the voltage V3C to the word line WL. Accordingly, the voltage Vne and the voltage Vfa of the word line WL are set to the target voltage V2 at high speed.

Figure 9B:
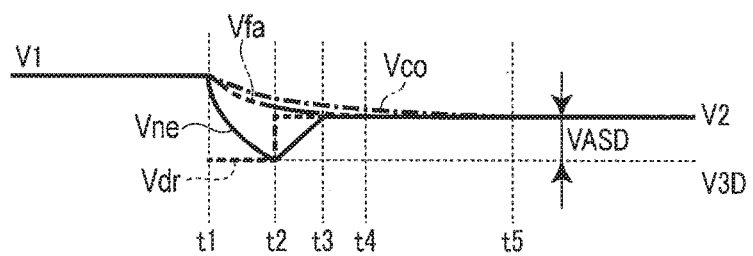

2.1.2.2 when the Difference Between the Pre-Discharge Voltage V1 and the Target Voltage V2 is Small FIG. 9B shows the applied voltage Vdr when the voltage difference between the pre-discharge voltage V1 and the target voltage V2 of the word line WL is small and the voltages Vne, Vfa changed depending on the applied voltage Vdr.

As shown in FIG. 9B, the driver 114 applies a voltage V3D as the applied voltage Vdr to the word line WL from time t1 to time t2. The voltage V3D is a voltage lower than the target voltage V2 by an assist voltage VASD. The assist voltage VASD is lower than the assist voltage VASC. The period (from time t1 to time t2) in which the voltage V3D is applied may be the same as the period in which the voltage V3C is applied in FIG. 9A or different therefrom.

More specifically, the logic circuit 122 stores information (hereinafter, fourth voltage information) indicating the assist voltage VASD (or the voltage V3D) in accordance with the voltage difference between the pre-discharge voltage V1 and the target voltage V2. The sequencer 121 controls the voltage generator 124 and the driver 114 based on the fourth voltage information. Then, the voltage generator 124 and the driver 114 apply the voltage V3D to the word line WL based on the control of the sequencer 121. That is, the sequencer 121 applies the voltage V3D, which is lower than the target voltage V2 by the assist voltage VASD in accordance with the voltage difference between the pre-charge voltage V1 and the target voltage V2, to the word line WL by the driver 114. For example, the sequencer 121 applies a voltage lower than the target voltage V2 by ½, ¼, or ⅛ of the voltage difference between the pre-discharge voltage V1 and the target voltage V2 to the word line WL. Accordingly, the voltage Vne of the word line area WLne of the word line WL falls from the voltage V1 (time t1) to the voltage V3D (time t2).

Next, after time t2 passes, the driver 114 applies the target voltage v2 as the applied voltage Vdr to the word line WL. Accordingly, the voltage Vne of the word line area WLne rises from the voltage V3D to become the target voltage V2 at time t3.

On the other hand, in contrast to the voltage Vne, the voltage Vfa of the word line area WLfa of the word line WL gradually falls from the voltage V1 (time t1) to the voltage V2 (time t4). The voltage Vfa is higher than the voltage V2 at times t2, t3 and reaches the voltage V2 at time t4.

In FIG. 9B, as a comparative example, a voltage of the word line area WLfa when the target voltage V2 is applied from time t1 to time t5 without applying the voltage V3D to the word line WL from time t1 to time t2 was indicated by Vco.

The voltage Vfa falls faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage v2 at time t4.

In the example shown in FIG. 9B, the voltage V3D, which is lower than the target voltage V2 by the assist voltage VASD, is applied to the word line WL from time t1 to time t2. The assist voltage VASD is set by the sequencer 121 to a voltage lower than the assist voltage VASC in accordance with the voltage difference between the pre-discharge voltage V1 and the target voltage V2. The fall of the voltage Vfa is made faster than that of the voltage Vco by applying the voltage V3D to the word line WL. Accordingly, the voltage Vne and the voltage Vfa of the word line WL are set to the target voltage V2 at high speed.

In the embodiment described above, the voltages V3A, V3B held by the word line WL in each case at time t2 are top voltages that are maximum values between time t1 and time t2. The voltages V3C, V3D are bottom voltages that are minimum values between time t1 and time t2. Also, after time t3, the target voltage V2 held by the word line may slightly vibrate in some cases. In such a case, the target voltage V2 may be the average value of vibrating voltages or the maximum voltage or minimum voltage of vibrating voltages. Also, the period in which each of the voltages V3A, V3B, V3C, V3D is applied to the word line WL is arbitrary.

2.2 Read Operation and Program Verification Operation of Memory Cell Transistor in FIG. 5

2.2.1 Read Operation

The memory cell transistors MT shown in FIG. 5 can hold 2-bit data. As an example of the voltage transition in the word line WL of these memory cell transistors MT, an operation to charge the word line WL in page-by-page reading (lower page reading and upper page reading) will be described. In the timing charts of FIGS. 10 to 15, the voltage Vne of the word line area WLne is shown. Each of time T1 to time T8 in FIG. 10 and subsequent diagrams does not indicate the same time and indicates any time in each diagram.

In upper page reading, as shown in FIG. 10, for example, the upper page is read by setting the word line WL to the voltage VA and then, read by setting to the voltage VC.

First, the driver 114 applies a voltage VAa to the selected word line WL of a pre-charge voltage (for example, 0 V) in the period from time T1 to time T2. The voltage VAa is a voltage obtained by adding an assist voltage VAS1a to a target voltage VA. That is, like the operations described with reference to FIGS. 8A and 8B, the sequencer 121 applies the voltage VAa, which is higher than the target voltage VA by the assist voltage VAS1a in accordance with the voltage difference between the pre-charge voltage and the target voltage VA, to the word line WL by the driver 114. The voltage of the word line WL rises from 0 V (time T1) to the voltage VAa (time T2).

After time T2 passes, the driver 114 applies the target voltage VA to the word line WL. Accordingly, the voltage of the word line WL converges to the target voltage VA. Then, reading is performed at the voltage VA.

Next, the driver 114 applies a voltage VCa to the selected word line WL charged to the voltage VA in the period from time T3 to time T4. The voltage VCa is a voltage obtained by adding an assist voltage VAS2a to a target voltage VC. That is, like the operations described with reference to FIGS. 8A and 8B, the sequencer 121 applies the voltage VCa, which is higher than the target voltage VC by the assist voltage VAS2a in accordance with the voltage difference between the voltage VA (pre-charge voltage) and the target voltage VC, to the word line WL by the driver 114. Accordingly, the voltage of the word line WL rises from VA (time T3) to the voltage VCa (time T4).

After time T4 passes, the driver 114 applies the target voltage VC to the word line WL. Accordingly, the voltage of the word line WL converges to the target voltage VC. Then, reading is performed at the voltage VC.

In lower page reading, as shown in FIG. 10, for example, the lower page is read by setting the word line WL to the voltage VB.

The driver 114 applies a voltage VBa to the selected word line WL of a pre-charge voltage (for example, 0 V) in the period from time T6 to time T7. The voltage VBa is a voltage obtained by adding an assist voltage VAS3a to a target voltage VB. That is, like the operations described with reference to FIGS. 8A and 8B, the sequencer 121 applies the voltage VBa, which is higher than the target voltage VB by the assist voltage VAS3a in accordance with the voltage difference between the pre-charge voltage and the target voltage VB, to the word line WL by the driver 114. Accordingly, the voltage of the word line WL rises from 0 V (time T6) to the voltage VBa (time T7).

After time T7 passes, the driver 114 applies the target voltage VB to the word line WL. Accordingly, the voltage of the word line WL converges to the target voltage VB. Then, reading is performed at the voltage VB.

In the embodiment described above and a subsequent embodiment, the target voltage held by the word line WL may slightly vibrate in some cases. In such a case, the target voltage may be the average value of vibrating voltages or the maximum voltage or minimum voltage of vibrating voltages. Also, the period in which the voltage obtained by adding the assist voltage to the target voltage is applied to the word line WL is arbitrary.

2.2.2 Program Verification Operation

When writing, programming and program verification are repeatedly performed to perform A-level to C-level writing into memory cells. Here, an operation to charge the word line WL in program verification by a voltage VfyA, a voltage VfyB, and a voltage VfyC after programming will be described.

Figure 11:
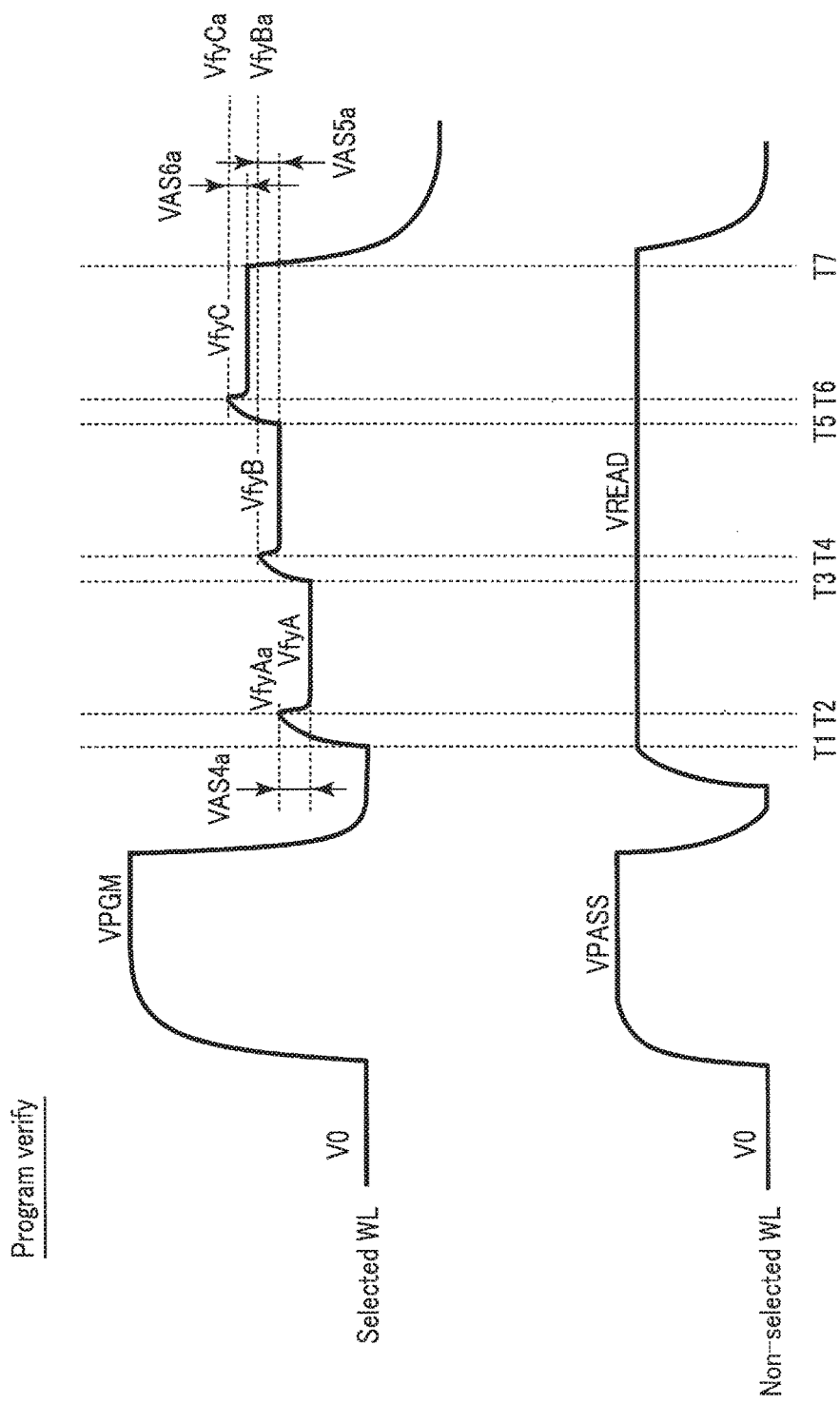
FIG. 11 is a diagram showing a first example of the word line charge operation during program verification in the semiconductor memory device according to the first embodiment.

As shown in FIG. 11, after programming by setting the word line WL to the voltage VPGM, for example, program verification is performed by successively setting the word line WL to the voltage VfyA, the voltage VfyB, and the voltage VfyC.

First, the driver 114 applies the voltage VfyAa to the selected word line WL of a pre-charge voltage (for example, 0 V) in the period from time T1 to time T2. The voltage VfyAa is a voltage obtained by adding an assist voltage VAS4a to a target voltage VfyA. That is, like the operations described with reference to FIGS. 8A and 8B, the sequencer 121 applies the voltage VfyAa, which is higher than the target voltage VfyA by the assist voltage VAS4a in accordance with the voltage difference between the pre-charge voltage and the target voltage VfyA, to the word line WL by the driver 114. Accordingly, the voltage of the word line WL rises from 0 V (time T1) to the voltage VfyAa (time T2).

After time T2 passes, the driver 114 applies the target voltage VfyA to the word line WL. Accordingly, the voltage of the word line WL converges to the target voltage VfyA. Then, the program verification is performed at the voltage VfyA.

Next, the driver 114 applies a voltage VfyBa to the selected word line WL charged to the voltage VfyA in the period from time T3 to time T4. The voltage VfyBa is a voltage obtained by adding an assist voltage VAS5a to a target voltage VfyB. That is, like the operations described with reference to FIGS. 8A and 8B, the sequencer 121 applies the voltage VfyBa, which is higher than the target voltage VfyB by the assist voltage VAS5a in accordance with the voltage difference between the voltage VfyA (pre-charge voltage) and the target voltage VfyB, to the word line WL by the driver 114. Accordingly, the voltage of the word line WL rises from VfyA (time T3) to the voltage VfyBa (time T4).

After time T4 passes, the driver 114 applies the target voltage VfyB to the word line WL. Accordingly, the voltage of the word line WL converges to the target voltage VfyB. Then, the program verification is performed at the voltage VfyB.

Next, the driver 114 applies a voltage VfyCa to the selected word line WL charged to the voltage VfyB in the period from time T5 to time T6. The voltage VfyCa is a voltage obtained by adding an assist voltage VAS6a to a target voltage VfyC. That is, like the operations described with reference to FIGS. 8A and 8B, the sequencer 121 applies the voltage VfyCa, which is higher than the target voltage VfyC by the assist voltage VAS6a in accordance with the voltage difference between the voltage VfyB (pre-charge voltage) and the target voltage VfyC, to the word line WL by the driver 114. The voltage of the word line WL rises from VfyB (time T5) to the voltage VfyCa (time T6).

After time T6 passes, the driver 114 applies the target voltage VfyC to the word line WL. Accordingly, the voltage of the word line WL converges to the target voltage VfyC. Then, the program verification is performed at the voltage VfyC.

2.3 Read Operation and Program Verification Operation of Memory Cell Transistor in FIG. 6

2.3.1 Read Operation

Figure 13:
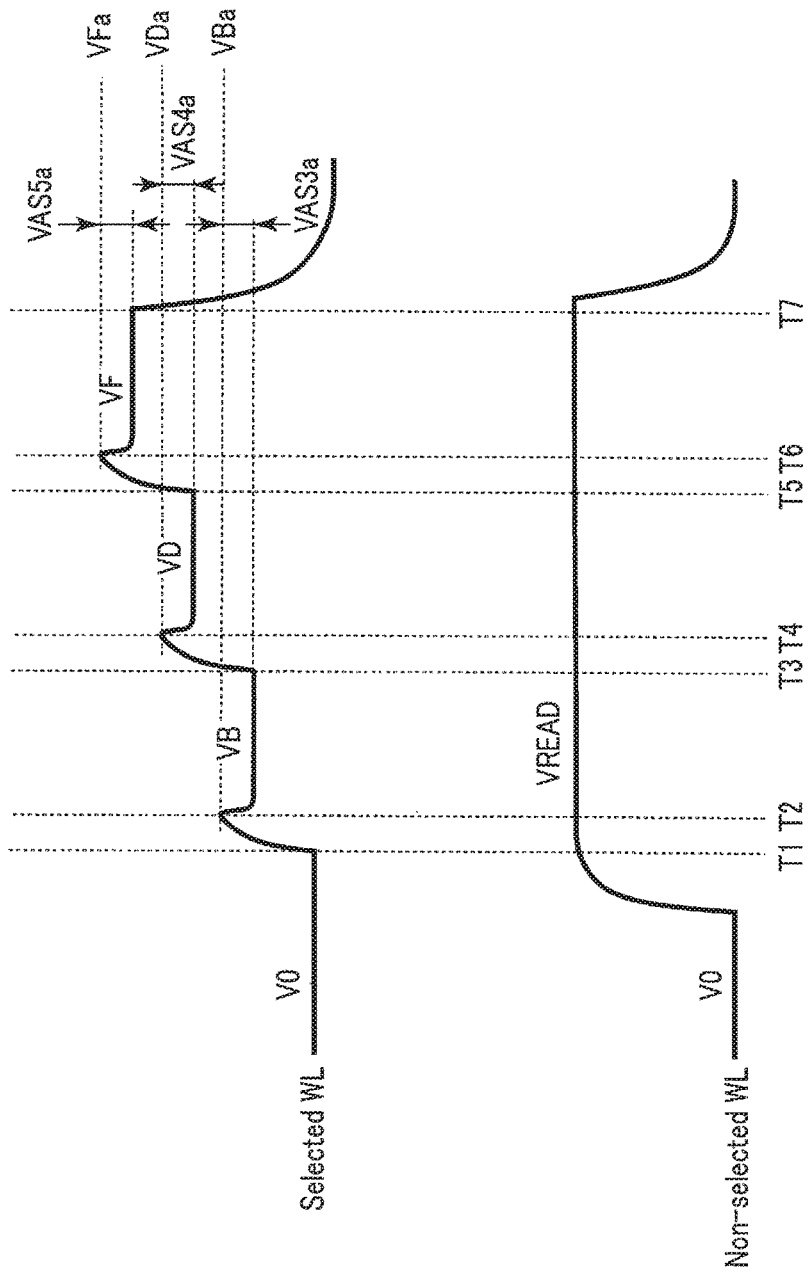
FIG. 13 is a diagram showing a third example of the word line charge operation during reading in the semiconductor memory device according to the first embodiment.
Figure 14:
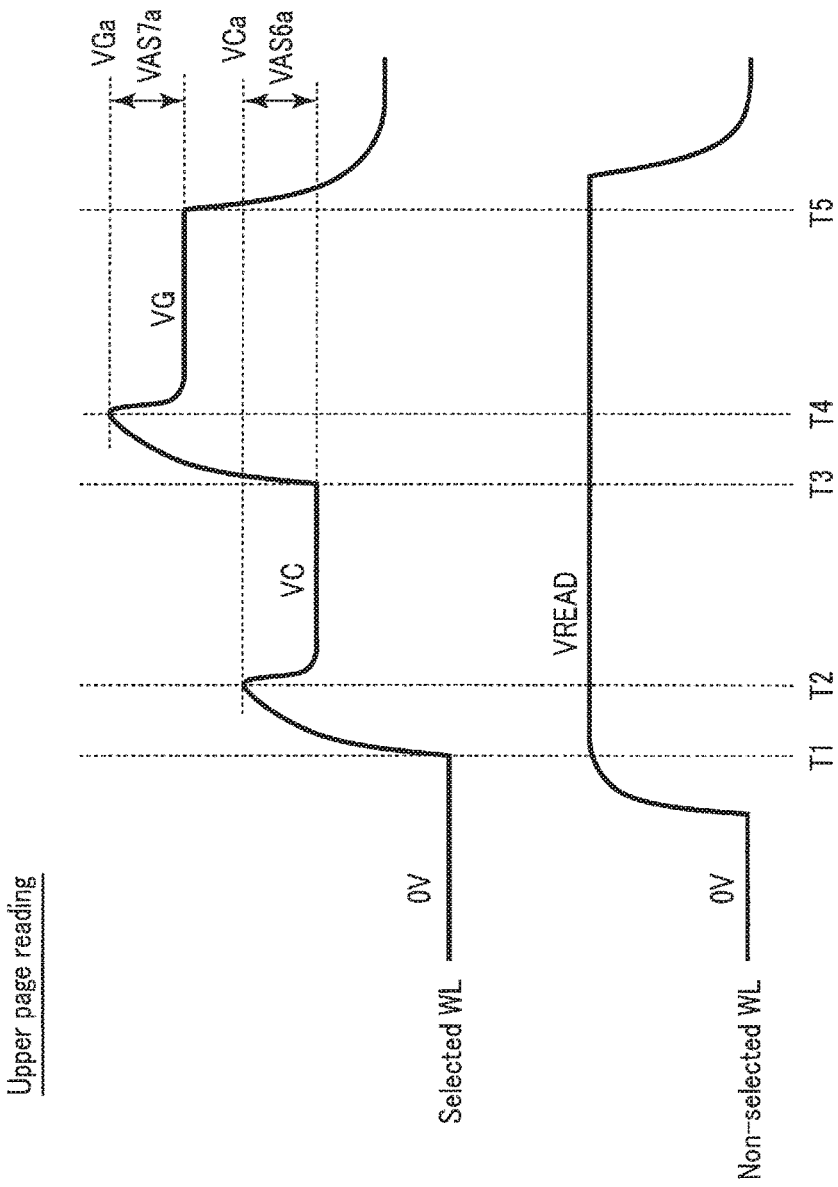
FIG. 14 is a diagram showing a fourth example of the word line charge operation during reading in the semiconductor memory device according to the first embodiment.

The memory cell transistors MT shown in FIG. 6 can hold 3-bit data. As an example of the voltage transition in the word line WL of these memory cell transistors MT, an operation to charge the word line WL in page-by-page reading (lower page reading, middle page reading, and upper page reading) is shown in FIGS. 12 to 14.

2.3.1.1 Lower Page Reading

In lower page reading, as shown in FIG. 12, for example, the lower page is read by setting the word line WL to the voltage VA and then, read by setting to the voltage VE.

The operation shown in FIG. 12 is different from the read operation shown in FIG. 10 in portions of the pre-charge voltage and the target voltage, but the substantial operation to charge the pre-charge voltage to the target voltage is the same and so the description thereof is omitted.

2.3.1.2 Middle Page Reading

In middle page reading, as shown in FIG. 13, for example, the middle page is read by setting the word line WL to the voltage VB and then, read by setting to the voltage VD and further, read by setting to the voltage VF.

The operation shown in FIG. 13 is different from the read operation shown in FIG. 10 in the pre-charge voltage and the target voltage, but the substantial operation to charge the pre-charge voltage to the target voltage is the same and so the description thereof is omitted.

2.3.1.3 Upper Page Reading

In upper page reading, as shown in FIG. 14, for example, the upper page is read by setting the word line WL to the voltage VC and then, read by setting to the voltage VG.

The operation shown in FIG. 14 is different from the read operation shown in FIG. 10 in the pre-charge voltage and the target voltage, but the substantial operation to charge the pre-charge voltage to the target voltage is the same and so the description thereof is omitted.

2.3.2 Program Verification Operation

When writing, programming and program verification are repeatedly performed to perform A-level to G-level writing into memory cells. Here, an operation to charge the word line WL in program verification by the voltage VfyA, the voltage VfyB, and the voltage VfyC after programming is shown in FIG. 15.

As shown in FIG. 15, after programming by setting the word line WL to the voltage VPGM, for example, program verification is performed by successively setting the word line WL to the voltage VfyA, the voltage VfyB, and the voltage VfyC.

In the program verification operation shown in FIG. 11, the operation shown in FIG. 15 is the same in the substantial operation to charge the pre-charge voltage to the target voltage and so the description thereof is omitted.

3. Effects of the First Embodiment

According to a semiconductor memory device in the first embodiment, the word line WL can be charged and discharged faster and the word line can be set to the target voltage at high speed. Further, because the word line can be set to the target voltage at high speed, the read operation and the program verification operation can be made faster.

Hereinafter, effects of the present embodiment will be described in detail.

Figure 16:
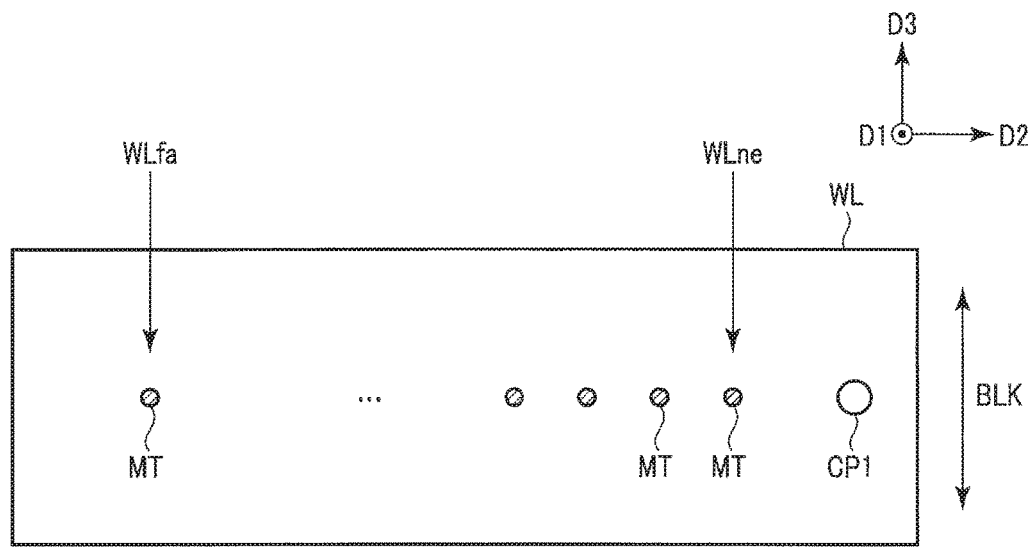
FIG. 16 is a plan view showing an example of a current path of a word line in the semiconductor memory device according to the first embodiment.

In the read operation and the program verification operation, an operation to set the word line voltage to a desired voltage (target voltage) by charging and discharging the word line WL is performed. FIG. 16 shows the configuration of the word line WL when the driver 114 (or the row decoder 112) is arranged on one side of the memory cell array 111. In the configuration shown in FIG. 16, a voltage is applied from the driver 114 arranged on one side to the word line WL via the contact plug CP1. The word line WL has the word line area WLne positioned in an area where the current pat length from the driver 114 (or the contact plug CP1) is short and the word line area WLfa positioned in an area where the current pat length from the driver 114 is long. Thus, a difference of charge/discharge time of the word line areas WLne, WLfa arises in accordance with the current path length from the driver 114 to the word line areas WLne, WLfa.

Figure 17:
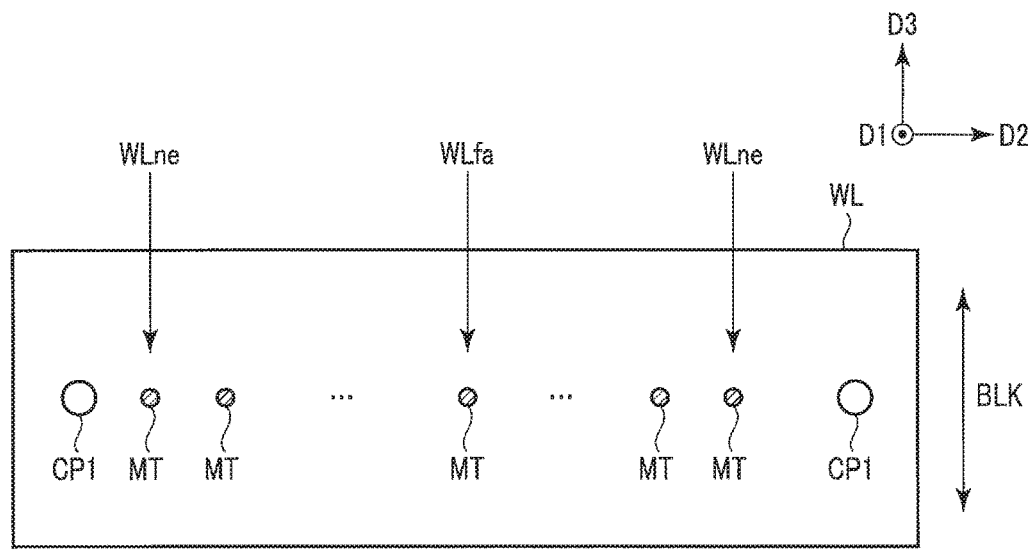
FIG. 17 is a plan view showing another example of the current path of the word line in the semiconductor memory device according to the first embodiment.

FIG. 17 shows the configuration of the word line WL when the driver 114 (or the row decoder 112) is arranged on both sides of the memory cell array 111. In the configuration shown in FIG. 17, a voltage is applied from the driver 114 arranged on both sides to the word line WL via the contact plug CP1. Even in such a configuration, a difference of charge/discharge time of the word line areas WLne, WLfa arises in accordance with the current path length from the driver 114 to the word line areas WLne, WLfa.

Thus, in the first embodiment, a voltage higher (or lower) than the target voltage by the assist voltage in accordance with a voltage difference between the pre-transition voltage and the target voltage is applied to the word line. For example, if the voltage difference between the pre-transition voltage and the target voltage is large, a large first assist voltage is applied to the word line WL and if the voltage difference is small, a second assist voltage, which is lower than the first assist voltage, is applied. Also, for example, a voltage higher (or lower) than the target voltage by a voltage of ½, ¼, or ⅛ of a voltage difference between the pre-transition voltage and the target voltage is applied to the word line WL. Accordingly, vibrations of the voltage Vne arising in the word line area WLne where the current path length from the driver 114 is short can be suppressed and also the voltage Vfa of the word line area WLfa where the current path length from the driver 114 is long can be charged/discharged quickly. As a result, the word line can be set to the target voltage at high speed. Further, because the word line can be set to the target voltage at high speed, the read operation and the program verification operation can be made faster.

Second Embodiment

Only differences of the semiconductor memory device according to the second embodiment from the device in the first embodiment will be described. The overall configuration of a NAND flash memory 100 and the configurations of a memory cell array 111, a driver 114 and the like are the same as those in the first embodiment and so the description thereof is omitted.

1. Operation of Semiconductor Memory Device

The second embodiment is different from the first embodiment in that the period in which an assist voltage higher or lower than the target voltage is applied to a word line WL (hereinafter, denoted as an assist period) is made variable in accordance with a voltage difference between the pre-transition voltage and the target voltage. Hereinafter, an operation to cause the word line voltage to transition at high speed by making the assist period variable in a read operation or program verification operation of the NAND flash memory 100 will be described.

1.1 Transition Operation of Word Line Voltage (Assist Period Variable)

Cases in which a target voltage V2 of the word line WL is higher and lower than a pre-transition voltage V1 will be separately described and further, cases in which the difference between the pre-transition voltage V1 and the target voltage V2 is large and small will be separately described.

1.1.1 when the Target Voltage V2 is Higher than the Pre-Transition Voltage V1

An operation to charge the pre-transition voltage V1 of the word line WL to the target voltage V2, which is higher than the voltage V1, will be described.

Figure 18A:
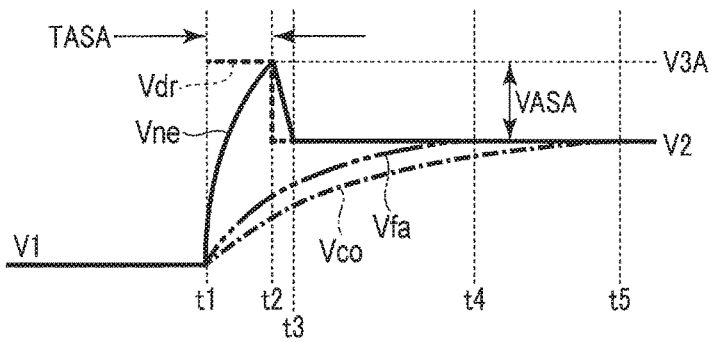
FIGS. 18A and 18B are diagrams showing the transition operation of the word line voltage in the semiconductor memory device according to a second embodiment.

1.1.1.1 when the Difference Between the Pre-Charge Voltage V1 and the Target Voltage V2 is Large FIG. 18A shows an applied voltage Vdr when the voltage difference between the pre-charge voltage V1 and the target voltage V2 of the word line WL is large and voltages Vne, Vfa changed depending on the applied voltage Vdr.

As shown in FIG. 18A, the driver 114 applies a voltage V3A as the applied voltage Vdr to the word line WL in an assist period TASA from time t1 to time t2. The assist period TASA is set by a sequencer 121 in accordance with the voltage difference between the pre-charge voltage V1 and the target voltage V2. The voltage V3A only needs to be a voltage higher than the target voltage V2 and may be a constant voltage or, like in the first embodiment, a variable voltage. Here, the voltage V3A is a voltage obtained by adding an assist voltage VASA to the target voltage V2.

More specifically, a logic circuit 122 stores information (hereinafter, first period information) indicating the assist period TASA in accordance with the voltage difference between the pre-charge voltage V1 and the target voltage V2. The sequencer 121 causes a register 123 to temporarily hold the first period information. The sequencer 121 controls a voltage generator 124 and the driver 114 based on the first period information. Then, the voltage generator 124 and the driver 114 apply the voltage V3A to the word line WL in the assist period TASA based on the control of the sequencer 121. That is, the sequencer 121 applies the voltage V3A to the word line WL by the driver 114 in the assist period TASA in accordance with the voltage difference between the pre-charge voltage V1 and the target voltage V2. Accordingly, the voltage Vne of the word line area WLne of the word line WL rises from the voltage V1 (time t1) to the voltage V3A (time t2).

Next, after the assist period TASA (from time t1 to time t2) passes, the driver 114 applies the target voltage V2 as the applied voltage Vdr to the word line WL. Accordingly, a voltage Vne of a word line area WLne falls from the voltage V3A to become the target voltage V2 at time t3.

On the other hand, in contrast to the voltage Vne, a voltage Vfa of the word line area WLfa of the word line WL gradually rises from the voltage V1 (time t1) to the voltage V2 (time t4).

The voltage Vfa rises faster than a voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 18A, the voltage V3A, which is higher than the target voltage V2, is applied to the word line WL in the assist period TASA. The assist period TASA is set by a sequencer 121 in accordance with the voltage difference between the pre-charge voltage V1 and the target voltage V2. The rise of the voltage Vfa is made faster than that of the voltage Vco by applying the voltage V3A to the word line WL in the assist period TASA. Accordingly, the voltage Vne and the voltage Vfa of the word line WL are set to the target voltage V2 at high speed.

Figure 18B:
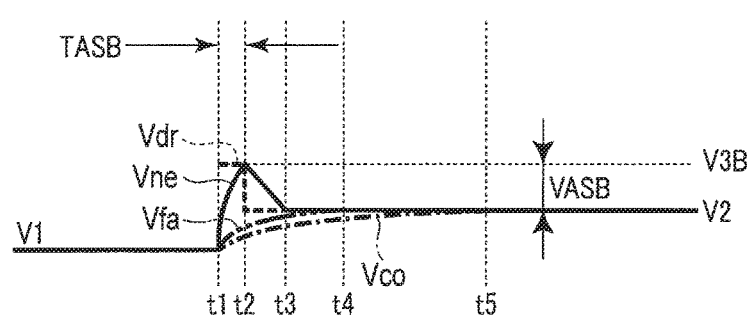

1.1.1.2 when the Difference Between the Pre-Charge Voltage V1 and the Target Voltage V2 is Small FIG. 18B shows the applied voltage Vdr when the voltage difference between the pre-charge voltage V1 and the target voltage V2 of the word line WL is small and the voltages Vne, Vfa changed depending on the applied voltage Vdr.

As shown in FIG. 18B, the driver 114 applies a voltage V3B as the applied voltage Vdr to the word line WL in an assist period TASB from time t1 to time t2. The assist period TASB is set by the sequencer 121 in accordance with the voltage difference between the pre-charge voltage V1 and the target voltage V2. The assist period TASB is shorter than the assist period TASA. The voltage V3B only needs to be a voltage higher than the target voltage V2 and may be a constant voltage or, like in the first embodiment, a variable voltage. Here, the voltage V3B is a voltage obtained by adding an assist voltage VASB to the target voltage V2.

More specifically, the logic circuit 122 stores information (hereinafter, second period information) indicating the assist period TASB in accordance with the voltage difference between the pre-charge voltage V1 and the target voltage V2. The sequencer 121 causes the register 123 to temporarily hold the second period information. The sequencer 121 controls the voltage generator 124 and the driver 114 based on the second period information. Then, the voltage generator 124 and the driver 114 apply the voltage V3B to the word line WL in the assist period TASB based on the control of the sequencer 121. That is, the sequencer 121 applies the voltage V3B to the word line WL by the driver 114 in the assist period TASB in accordance with the voltage difference between the pre-charge voltage V1 and the target voltage V2. Accordingly, the voltage Vne of the word line area WLne of the word line WL rises from the voltage V1 (time t1) to the voltage V3B (time t2).

Next, after the assist period TASB (from time t1 to time t2) passes, the driver 114 applies the target voltage V2 as the applied voltage Vdr to the word line WL. Accordingly, the voltage Vne of the word line area WLne falls from the voltage V3B to become the target voltage V2 at time t3.

On the other hand, in contrast to the voltage Vne, the voltage Vfa of the word line area WLfa of the word line WL gradually rises from the voltage V1 (time t1) to the voltage V2 (time t4).

The voltage Vfa rises faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 18B, the voltage V3B, which is higher than the target voltage V2, is applied to the word line WL in the assist period TASB, which is shorter than the assist period TASA. The assist period TASB is set by the sequencer 121 to a period shorter than the assist period TASA in accordance with the voltage difference between the pre-charge voltage V1 and the target voltage V2. The rise of the voltage Vfa is made faster than that of the voltage Vco by applying the voltage V3B to the word line WL in the assist period TASB. Accordingly, the voltage Vne and the voltage Vfa of the word line WL are set to the target voltage V2 at high speed.

1.1.2 when the Target Voltage V2 is Lower than the Pre-Transition Voltage V1

An operation to discharge the pre-transition voltage V1 of the word line WL to the target voltage V2, which is lower than the voltage V1, will be described. An operation similar to the operation when the target voltage V2 is higher than the pre-transition voltage V1 described above is omitted.

Figure 19A:
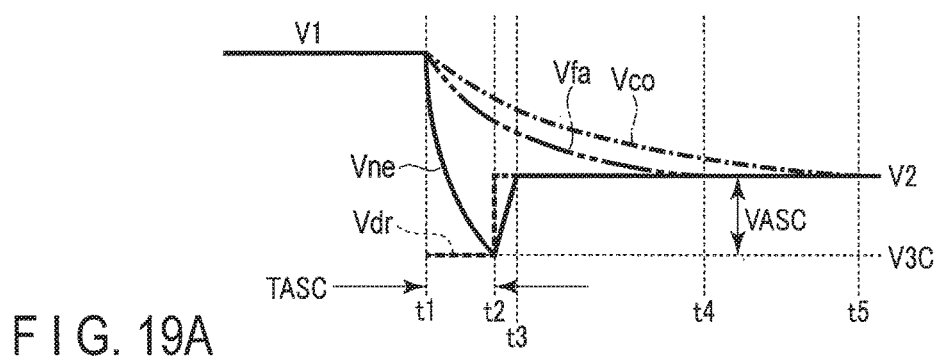
FIGS. 19A and 19B are diagrams showing another transition operation of the word line voltage in the semiconductor memory device according to the second embodiment.

1.1.2.1 when the Difference Between the Pre-Discharge Voltage V1 and the Target Voltage V2 is Large FIG. 19A shows the applied voltage Vdr when the voltage difference between the pre-discharge voltage V1 and the target voltage V2 of the word line WL is large and the voltages Vne, Vfa changed depending on the applied voltage Vdr.

As shown in FIG. 19A, the driver 114 applies a voltage V3C as the applied voltage Vdr to the word line WL in an assist period TASC from time t1 to time t2. The assist period TASC is set by the sequencer 121 in accordance with the voltage difference between the pre-discharge voltage V1 and the target voltage V2. The voltage V3C only needs to be a voltage lower than the target voltage V2 and may be a constant voltage or, like in the first embodiment, a variable voltage. Here, the voltage V3C is a voltage lower than the target voltage V2 by an assist voltage VASC.

More specifically, the logic circuit 122 stores information (hereinafter, third period information) indicating the assist period TASC in accordance with the voltage difference between the pre-discharge voltage V1 and the target voltage V2. The sequencer 121 causes the register 123 to temporarily hold the third period information. The sequencer 121 controls the voltage generator 124 and the driver 114 based on the third period information. Then, the voltage generator 124 and the driver 114 apply the voltage V3C to the word line WL in the assist period TASC based on the control of the sequencer 121. That is, the sequencer 121 applies the voltage V3C to the word line WL by the driver 114 in the assist period TASC in accordance with the voltage difference between the pre-discharge voltage V1 and the target voltage V2. Accordingly, the voltage Vne of the word line area WLne of the word line WL falls from the voltage V1 (time t1) to the voltage V3C (time t2).

Next, after the assist period TASC (from time t1 to time t2) passes, the driver 114 applies the target voltage V2 as the applied voltage Vdr to the word line WL. Accordingly, the voltage Vne of the word line area WLne rises from the voltage V3C to become the target voltage V2 at time t3.

On the other hand, in contrast to the voltage Vne, the voltage Vfa of the word line area WLfa of the word line WL gradually falls from the voltage V1 (time t1) to the voltage V2 (time t4).

The voltage Vfa falls faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 19A, the voltage V3C, which is lower than the target voltage V2 by the assist voltage VASC, is applied to the word line WL in the assist period TASC. The assist period TASC is set by the sequencer 121 in accordance with the voltage difference between the pre-discharge voltage V1 and the target voltage V2. The fall of the voltage Vfa is made faster than that of the voltage Vco by applying the voltage V3C to the word line WL in the assist period TASC. Accordingly, the voltage Vne and the voltage Vfa of the word line WL are set to the target voltage V2 at high speed.

Figure 19B:
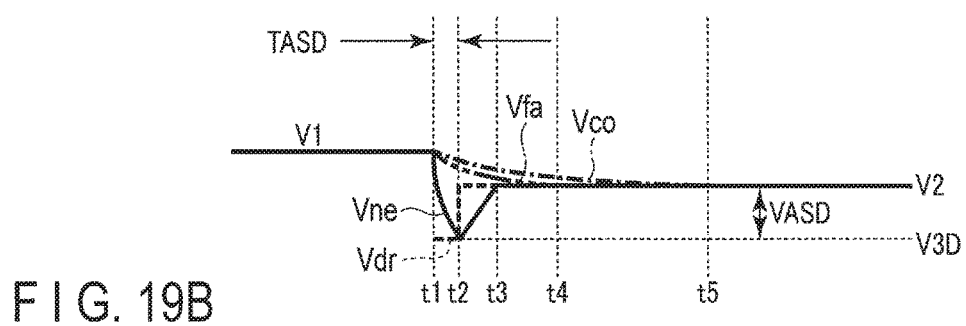

1.1.2.2 when the Difference Between the Pre-Discharge Voltage V1 and the Target Voltage V2 is Small FIG. 19B shows the applied voltage Vdr when the voltage difference between the pre-discharge voltage V1 and the target voltage V2 of the word line WL is small and the voltages Vne, Vfa changed depending on the applied voltage Vdr.

As shown in FIG. 19B, the driver 114 applies a voltage V3D as the applied voltage Vdr to the word line WL in an assist period TASD from time t1 to time t2. The assist period TASD is set by the sequencer 121 in accordance with the voltage difference between the pre-discharge voltage V1 and the target voltage V2. The assist period TASD is shorter than the assist period TASC. The voltage V3D only needs to be a voltage lower than the target voltage V2 and may be a constant voltage or, like in the first embodiment, a variable voltage. Here, the voltage V3D is a voltage lower than the target voltage V2 by an assist voltage VASD.

More specifically, the logic circuit 122 stores information (hereinafter, fourth period information) indicating the assist period TASD in accordance with the voltage difference between the pre-charge voltage V1 and the target voltage V2. The sequencer 121 causes the register 123 to temporarily hold the fourth period information. The sequencer 121 controls the voltage generator 124 and the driver 114 based on the fourth period information. Then, the voltage generator 124 and the driver 114 apply the voltage V3D to the word line WL in the assist period TASD based on the control of the sequencer 121. That is, the sequencer 121 applies the voltage V3D to the word line WL by the driver 114 in the assist period TASD in accordance with the voltage difference between the pre-charge voltage V1 and the target voltage V2. Accordingly, the voltage Vne of the word line area WLne of the word line WL falls from the voltage V1 (time t1) to the voltage V3D (time t2).

Next, after the assist period TASD (from time t1 to time t2) passes, the driver 114 applies the target voltage V2 as the applied voltage Vdr to the word line WL. Accordingly, the voltage Vne of the word line area WLne rises from the voltage V3D to become the target voltage V2 at time t3.

On the other hand, in contrast to the voltage Vne, the voltage Vfa of the word line area WLfa of the word line WL gradually falls from the voltage V1 (time t1) to the voltage V2 (time t4).

The voltage Vfa falls faster than the voltage Vco and reaches the voltage V2 in a time (time t1 to time t4) shorter than a time (time t1 to time t5) in which the voltage Vco reaches the target voltage V2. From the above, the voltages Vne, Vfa of the word line WL are set to the target voltage V2 at time t4.

In the example shown in FIG. 19B, the voltage V3D, which is lower than the target voltage V2, is applied to the word line WL in the assist period TASD, which is shorter than the assist period TASC. The assist period TASD is set by the sequencer 121 to a period shorter than the assist period TASC in accordance with the voltage difference between the pre-charge voltage V1 and the target voltage V2. The rise of the voltage Vfa is made faster than that of the voltage Vco by applying the voltage V3D to the word line WL in the assist period TASD. Accordingly, the voltage Vne and the voltage Vfa of the word line WL are set to the target voltage V2 at high speed.

1.2 Read Operation and Program Verification Operation of Memory Cell Transistor in FIG. 5

1.2.1 Read Operation

As an example of the voltage transition in the word line WL of the memory cell transistors MT shown in FIG. 5, an operation to charge the word line WL in page-by-page reading (lower page reading and upper page reading) will be described. In the timing charts of FIGS. 20 to 25, the voltage Vne of the word line area WLne is shown.

In upper page reading, as shown in FIG. 20, for example, the upper page is read by setting the word line WL to the voltage VA and then, read by setting to the voltage VC.

First, the driver 114 applies a voltage VAb to the selected word line WL of a pre-charge voltage (for example, 0 V) in an assist period TAS1 (from time T1 to time T2a). The assist period TAS1 and assist periods in the description that follows are set by the sequencer 121 in accordance with the voltage difference between the pre-charge voltage and the target voltage. The voltage VAb and voltages applied in each assist period in the description that follows only need to be a voltage higher than the target voltage and may be a constant voltage or, like in the first embodiment, a variable voltage. Here, the voltage VAb is a voltage obtained by adding an assist voltage VAS1b to a target voltage VA. That is, like the operations described with reference to FIGS. 18A and 18B, the sequencer 121 applies the voltage VAb, which is higher than the target voltage VA, to the word line WL by the driver 114 in the assist period TAS1 in accordance with the voltage difference between the pre-charge voltage and the target voltage VA. Accordingly, the voltage of the word line WL rises from 0 V (time T1) to the voltage VAb (time T2a).

Next, after the assist period TAS1 (from time t1 to time t2a) passes, the driver 114 applies the target voltage VA to the word line WL. Accordingly, the voltage of the word line WL converges to the target voltage VA. Then, reading is performed at the voltage VA.

Next, the driver 114 applies a voltage VCb to the selected word line WL of a pre-charge voltage VA in an assist period TAS2 (from time T3 to time T4a). Here, the voltage VCb is a voltage obtained by adding an assist voltage VAS2b to a target voltage VC. That is, like the operations described with reference to FIGS. 18A and 18B, the sequencer 121 applies the voltage VCb, which is higher than the target voltage VC, to the word line WL by the driver 114 in the assist period TAS1 in accordance with the voltage difference between the pre-charge voltage VA and the target voltage VC. Accordingly, the voltage of the word line WL rises from the voltage VA (time T3) to the voltage VCb (time T4a).

After the assist period TAS2 (from time T3 to time T4a) passes, the driver 114 applies the target voltage VC to the word line WL. Accordingly, the voltage of the word line WL converges to the target voltage VC. Then, reading is performed at the voltage VC.

In lower page reading, as shown in FIG. 20, for example, the lower page is read by setting the word line WL to the voltage VB.

The driver 114 applies a voltage VBb to the selected word line WL of a pre-charge voltage (for example, 0 V) in an assist period TAS3 (from time T6 to time T7a). Here, the voltage VBb is a voltage obtained by adding an assist voltage VAS3b to a target voltage VB. That is, like the operations described with reference to FIGS. 18A and 18B, the sequencer 121 applies the voltage VBb, which is higher than the target voltage VB, to the word line WL by the driver 114 in the assist period TAS3 in accordance with the voltage difference between the pre-charge voltage and the target voltage VB. Accordingly, the voltage of the word line WL rises from 0 V (time T6) to the voltage VBb (time T7a).

After the assist period TAS3 (from time T6 to time T7a) passes, the driver 114 applies the target voltage VB to the word line WL. Accordingly, the voltage of the word line WL converges to the target voltage VB. Then, reading is performed at the voltage VB.

1.2.2 Program Verification Operation

Here, an operation to charge the word line WL in program verification by a voltage VfyA, a voltage VfyB, and a voltage VfyC after programming will be described.

As shown in FIG. 21, after programming by setting the word line WL to a voltage VPGM, for example, program verification is performed by successively setting the word line WL to the voltage VfyA, the voltage VfyB, and the voltage VfyC.

First, the driver 114 applies a voltage VfyAb to the selected word line WL of a pre-charge voltage (for example, 0 V) in an assist period TAS4 (from time T1 to time T2b). Here, the voltage VfyAb is a voltage obtained by adding an assist voltage VAS4b to a target voltage VfyA. That is, like the operations described with reference to FIGS. 18A and 18B, the sequencer 121 applies the voltage VfyAb, which is higher than the target voltage VfyA, to the word line WL by the driver 114 in the assist period TAS4 in accordance with the voltage difference between the pre-charge voltage and the target voltage VfyA. Accordingly, the voltage of the word line WL rises from 0 V (time T1) to the voltage VfyAb (time T2b).

After the assist period TAS4 (from time T1 to time T2a) passes, the driver 114 applies the target voltage VfyA to the word line WL. Accordingly, the voltage of the word line WL converges to the target voltage VfyA. Then, the program verification is performed at the voltage VfyA.

Next, the driver 114 applies a voltage VfyBb to the selected word line WL of a pre-charge voltage VfyA in an assist period TAS5 (from time T3 to time T4b). Here, the voltage VfyBb is a voltage obtained by adding an assist voltage VAS5b to a target voltage VfyB. That is, like the operations described with reference to FIGS. 18A and 18B, the sequencer 121 applies the voltage VfyBb, which is higher than the target voltage VfyB, to the word line WL by the driver 114 in the assist period TAS5 in accordance with the voltage difference between the pre-charge voltage VfyA and the target voltage VfyB. Accordingly, the voltage of the word line WL rises from the voltage VfyA (time T3) to the voltage VfyBb (time T4b).

After the assist period TAS5 (from time T3 to time T4b) passes, the driver 114 applies the target voltage VfyB to the word line WL. Accordingly, the voltage of the word line WL converges to the target voltage VfyB. Then, the program verification is performed at the voltage VfyB.

Next, the driver 114 applies a voltage VfyCb to the selected word line WL of a pre-charge voltage VfyB in an assist period TAS6 (from time T5 to time T6b). Here, the voltage VfyCb is a voltage obtained by adding an assist voltage VAS6b to a target voltage VfyC. That is, like the operations described with reference to FIGS. 18A and 18B, the sequencer 121 applies the voltage VfyCb, which is higher than the target voltage VfyC, to the word line WL by the driver 114 in the assist period TAS6 in accordance with the voltage difference between the pre-charge voltage VfyB and the target voltage VfyC. Accordingly, the voltage of the word line WL rises from the voltage VfyB (time T5) to the voltage VfyCb (time T6b).

After the assist period TAS6 (from time T5 to time T6b) passes, the driver 114 applies the target voltage VfyC to the word line WL. Accordingly, the voltage of the word line WL converges to the target voltage VfyC. Then, the program verification is performed at the voltage VfyC.

1.3 Read Operation and Program Verification Operation of Memory Cell Transistor in FIG. 6

1.3.1 Read Operation

As an example of the voltage transition in the word line WL of the memory cell transistors MT shown in FIG. 6, an operation to charge the word line WL in page-by-page reading (lower page reading, middle page reading, and upper page reading) is shown in FIGS. 22 to 24.

1.3.1.1 Lower Page Reading

In lower page reading, as shown in FIG. 22, for example, the lower page is read by setting the word line WL to the voltage VA and then, read by setting to the voltage VE.

The operation shown in FIG. 22 is different from the read operation shown in FIG. 20 in portions of the pre-charge voltage and the target voltage, but the substantial operation to charge the pre-charge voltage to the target voltage is the same and so the description thereof is omitted.

1.3.1.2 Middle Page Reading

In middle page reading, as shown in FIG. 23, for example, the middle page is read by setting the word line WL to the voltage VB and then, read by setting to the voltage VD and further, read by setting to the voltage VF.

The operation shown in FIG. 23 is different from the read operation shown in FIG. 20 in the pre-charge voltage and the target voltage, but the substantial operation to charge the pre-charge voltage to the target voltage is the same and so the description thereof is omitted.

1.3.1.3 Upper Page Reading

In upper page reading, as shown in FIG. 24, for example, the upper page is read by setting the word line WL to the voltage VC and then, read by setting to the voltage VG.

The operation shown in FIG. 24 is different from the read operation shown in FIG. 20 in the pre-charge voltage and the target voltage, but the substantial operation to charge the pre-charge voltage to the target voltage is the same and so the description thereof is omitted.

1.3.2 Program Verification Operation

Here, an operation to charge the word line WL in program verification by the voltage VfyA, the voltage VfyB, and the voltage VfyC after programming is shown in FIG. 25.

As shown in FIG. 25, after programming by setting the word line WL to the voltage VPGM, for example, program verification is performed by successively setting the word line WL to the voltage VfyA, the voltage VfyB, and the voltage VfyC.

In the program verification operation shown in FIG. 21, the operation shown in FIG. 25 is the same in the substantial operation to charge the pre-charge voltage to the target voltage and so the description thereof is omitted.

2. Effects of the Second Embodiment

According to a semiconductor memory device in the second embodiment, the word line WL can be charged and discharged faster and the word line can be set to the target voltage at high speed. Further, because the word line can be set to the target voltage at high speed, the read operation and the program verification operation can be made faster.

Hereinafter, effects of the present embodiment will be described in detail.

Thus, in the second embodiment, the word line is charged and discharged faster by applying a voltage higher (or lower) than the target voltage to the word line in a variable assist period in accordance with the voltage difference between the pre-transition voltage and the target voltage.

For example, if the voltage difference between the pre-transition voltage and the target voltage is larger than a determination voltage, the assist period is made longer and if the voltage difference is smaller than the determination voltage, the assist period is made shorter. If the target voltage is higher than the pre-transition voltage, the voltage applied to the word line in the assist period may be a constant voltage higher than the target voltage or a changing voltage. If the target voltage is lower than the pre-transition voltage, the voltage applied to the word line in the assist period may be a constant voltage lower than the target voltage or a changing voltage. The changing voltage may be an assist voltage in accordance with the voltage difference between the pre-transition voltage and the target voltage used in the first embodiment.

In the second embodiment, as described above, a voltage higher (or lower) than the target voltage is applied to the word line in an assist period in accordance with the voltage difference between the pre-transition voltage and the target voltage. Accordingly, the word line WL can be charged and discharged faster and the word line can be set to the target voltage at high speed. Further, because the word line can be set to the target voltage at high speed, the read operation and the program verification operation can be made faster.

[Other Modifications]

The first and second embodiments include, for example, a word line connected to memory cells regardless of a nonvolatile memory (for example, a NAND flash memory), a volatile memory, system LSI or the like and can be applied to various semiconductor devices in which the word line needs to be charged.

The following modes can be adopted in each embodiment:

(1) In a read operation, the voltage applied to a word line selected for an A-level read operation is, for example, between 0 V and 0.55 V. However, the voltage is not limited to such an example and may be between 0.1 V and 0.24 V, between 0.21 V and 0.31 V, between 0.31 V and 0.4 V, between 0.4 V and 0.5 V, or between 0.5 V and 0.55 V.

The voltage applied to a word line selected for a B-level read operation is, for example, between 1.5 V and 2.3 V. However, the voltage is not limited to such an example and may be between 1.65 V and 1.8 V, between 1.8 V and 1.95 V, between 1.95 V and 2.1 V, or between 2.1 V and 2.3 V.

The voltage applied to a word line selected for a C-level read operation is, for example, between 3.0 V and 4.0 V. However, the voltage is not limited to such an example and may be between 3.0 V and 3.2 v, between 3.2 V and 3.4 V, between 3.4 V and 3.5 V, between 3.5 V and 3.6 V, or between 3.6 V and 4.0 V.

The time (tR) of a read operation may be, for example, between 25 μs and 38 μs, between 38 μs and 70 μs, or between 70 μs and 80 μs.

(2) A write operation includes, as described above, a programming operation and a verification operation. For a write operation, in addition to 15.0 V to 23.0 V described above, voltages described below may also be adopted.

More specifically, the voltage initially applied to a word line selected during programming operation is, for example, between 13.7 V and 14.3 V. However, the voltage is not limited to the above range and may be, for example, between 13.7 V and 14.0 V or between 14.0 V and 14.6 V.

The voltage initially applied to the selected word line when written into an odd-numbered word line and the voltage initially applied to the selected word line when written into an even-numbered word line may be changed.

If the ISPP method (Incremental Step Pulse Program) is adopted for the programming operation, for example, about 0.5 V can be cited as a step-up voltage.

Also, as the voltage applied to a non-selected word line, in addition to 7.0 V to 10.0 V described above, voltages described below may also be adopted.

More specifically, the voltage applied to a non-selected word line may be, for example, between 6.0 V and 7.3 V. However, the voltage is not limited to the above range and may be, for example, between 7.3 V and 8.4 V or equal to 6.0 V or less.

A pass voltage to be applied may be changed depending on whether a non-selected word line is an odd-numbered word line or an even-numbered word line.

The time (tProg) of a write operation may be, for example, between 1700 μs and 1800 μs, between 1800 μs and 1900 μs, or between 1900 μs and 2000 μs.

(3) In an erase operation, the voltage initially applied to a well formed in an upper portion of the semiconductor substrate and having the memory cell arranged above is, for example, between 12 V and 13.6 V. However, the voltage is not limited to such an example and may be between 13.6 V and 14.8 V, between 14.8 V and 19.0 V, between 19.0 V and 19.8 V, or between 19.8 V and 21 V.

The time (tErase) of an erase operation may be, for example, between 3000 μs and 4000 μs, between 4000 μs and 5000 μs, or between 4000 μs and 9000 μs.

(4) The structure of a memory cell has a charge storage layer arranged on the semiconductor substrate (silicon substrate) via a tunnel insulating film of the thickness 4 to 10 nm. The charge storage layer may adopt a stacked structure of an insulating film of SiN, SiON or the like of the thickness 2 to 3 nm and polysilicon of the thickness 3 to 8 nm. A metal such as Ru may be added to polysilicon. An insulating film is formed on the charge storage layer. The insulating film includes, for example, a silicon oxide film of the thickness 4 to 10 nm sandwiched between a lower High-k film of the thickness 3 to 10 nm and an upper High-k film of the thickness 3 to 10 nm. HfO or the like can be cited as the High-k film. Also, the thickness of the silicon oxide film can be made thicker than the thickness of the High-k film. A control electrode of the thickness 30 to 70 nm is formed on the insulating film via a material of the thickness 3 to 10 nm. The material is a metal oxide film of TaO or the like or a metal nitride film of TaN or the like. W or the like can be used for the control electrode.

Also, an air gap can be formed between memory cells.

According to the embodiments, as described above, a semiconductor memory device capable of charging and discharging a word line faster and setting the word line to a desired voltage at high speed is provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first word line coupled to a first memory cell; and
   a driver configured to apply a voltage to the first word line to read data in page units,
   wherein a first page data associated with the first word line is read by a first reading using a first voltage and by a second reading using a second voltage,
   wherein the driver is further configured to:
      apply a third voltage to the first word line during a first phase of the first reading, wherein a potential of the first word line is a fourth voltage before applying the third voltage, and the third voltage is higher than the first voltage by an amount which is based on a first difference, the first difference being a difference between the fourth voltage and the first voltage,
      apply the first voltage to the first word line during a second phase of the first reading after the first phase of the first reading,
      apply a fifth voltage to the first word line during a first phase of the second reading, wherein the fifth voltage is higher than the second voltage by an amount which is based on a second difference, the second difference being a difference between the first voltage and the second voltage, and
      apply the second voltage to the first word line during a second phase of the second reading after the first phase of the second reading,
   wherein the second difference is greater than the first difference, and a difference between the fifth voltage and the second voltage is greater than a difference between the third voltage and the first voltage, and
   wherein the first page data is sensed in the second phases of the first and second readings, respectively.

2. The semiconductor memory device according to claim 1,
   wherein the first phase of the first reading is based on the first difference, and the first phase of the second reading is based on the second difference.

3. The semiconductor memory device according to claim 2,
   wherein the first phase of the second reading is longer than the first phase of the first reading.

4. The semiconductor memory device according to claim 1,
   wherein the first page data is further read by a third reading using a sixth voltage, wherein the driver is further configured to:

apply a seventh voltage higher than the sixth voltage to the first word line during a first phase of the third reading, wherein the seventh voltage is based on a third difference which is a difference between the second voltage and the sixth voltage, and apply the sixth voltage to the first word line during a second phase of the third reading after the first phase of the third reading, and wherein the first page data is further sensed in the second phase of the third reading.

5. The semiconductor memory device according to claim 1, further comprising a second word line coupled to a second memory cell, wherein the driver is configured to apply a sixth voltage to the second word line during the first and second phases of the first and second readings.

6. The semiconductor memory device according to claim 1, wherein a second page data associated with the first word line is read by a third reading using a sixth voltage, wherein the driver is further configured to:

apply a seventh voltage higher than the sixth voltage to the first word line during a first phase of the third reading, wherein a potential of the first word line is an eighth voltage before applying the seventh voltage, and the seventh voltage is based on a third difference which is a difference between the eighth voltage and the sixth voltage, and apply the sixth voltage to the first word line during a second phase of the third reading after the first phase of the third reading, and wherein the second page data is sensed in the second phase of the third reading.

7. The semiconductor memory device according to claim 1, wherein the first and second readings include a program verification.

8. The semiconductor memory device according to claim 1, wherein the third voltage is higher than the first voltage by a voltage of ½, ¼, or ⅛ of the first difference, and the fifth voltage is higher than the second voltage by a voltage of ½, ¼, or ⅛ of the second difference.

* * * * *